US012803558B2

(12) United States Patent
Ohshima et al.

(10) Patent No.: US 12,803,558 B2
(45) Date of Patent: Nov. 17, 2026

(54) SEMICONDUCTOR DEVICE

(71) Applicant: SEMICONDUCTOR ENERGY LABORATORY CO., LTD., Atsugi (JP)

(72) Inventors: Kazuaki Ohshima, Atsugi (JP); Yoshiyuki Kurokawa, Sagamihara (JP); Kazuma Furutani, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 18/834,518

(22) PCT Filed: Feb. 13, 2023

(86) PCT No.: PCT/IB2023/051254

§ 371 (c)(1),
(2) Date: Jul. 30, 2024

(87) PCT Pub. No.: WO2023/161758

PCT Pub. Date: Aug. 31, 2023

(65) Prior Publication Data

US 2025/0158621 A1 May 15, 2025

(30) Foreign Application Priority Data

Feb. 25, 2022 (JP) ................................ 2022-027374

(51) Int. Cl.
*H03K 19/23* (2006.01)
*H03K 3/037* (2006.01)

(52) U.S. Cl.
CPC ........... *H03K 19/23* (2013.01); *H03K 3/0375* (2013.01)

(58) Field of Classification Search
None
See application file for complete search history.

(56) References Cited

U.S. PATENT DOCUMENTS 8,362,799 B2 1/2013 Arima
9,337,838 B2 5/2016 Saen et al.
(Continued)

FOREIGN PATENT DOCUMENTS

DE 102021107879 6/2022
EP 3748855 A 12/2020
(Continued)

OTHER PUBLICATIONS

International Search Report (Application No. PCT/IB2023/051254) Dated May 23, 2023.
(Continued)

*Primary Examiner* — Jany Richardson
(74) *Attorney, Agent, or Firm* — NIXON PEABODY LLP; Jeffrey L. Costellia

(57) ABSTRACT

A novel semiconductor device or the like is provided. The semiconductor device that includes a first flip-flop having a function of retaining input data in response to a clock signal and outputting first output data based on the input data; a second flip-flop having a function of retaining the input data in response to the clock signal and outputting second output data based on the input data; a third flip-flop having a function of retaining the input data in response to the clock signal and outputting third output data based on the input data; a majority circuit to which the first output data to the third output data are input and having a function of determining the most common logical value in the first output data to the third output data by majority decision making and outputting data of the determined logical value as fourth output data; and a switching circuit to which the first output data and the fourth output data are input and having a function of outputting output data based on the first output data or the fourth output data in response to a switching signal.

5 Claims, 20 Drawing Sheets

(56) References Cited

U.S. PATENT DOCUMENTS

| | | | | |
|---|---|---|---|---|
| 10,812,111 | B2 | 10/2020 | Lin | |
| 11,115,035 | B2 | 9/2021 | Narita et al. | |
| 2010/0026338 | A1* | 2/2010 | Fulcomer | H03K 19/00338 326/11 |
| 2011/0241724 | A1* | 10/2011 | Arima | H03K 19/00392 326/11 |
| 2014/0359403 | A1* | 12/2014 | Nakamura | G06F 11/0793 714/797 |
| 2021/0099180 | A1 | 4/2021 | Narita et al. | |

FOREIGN PATENT DOCUMENTS

| | | | |
|---|---|---|---|
| JP | 02-082333 | A | 3/1990 |
| JP | 03-050916 | A | 3/1991 |
| JP | 2006/027920 | | 7/2008 |
| JP | 2011-211607 | A | 10/2011 |
| JP | 2013-143687 | A | 7/2013 |
| JP | 2015-154417 | A | 8/2015 |
| JP | 2019-164472 | A | 9/2019 |
| JP | 2019-191064 | A | 10/2019 |
| JP | 2019-220763 | A | 12/2019 |
| WO | WO-2006/027920 | | 3/2006 |
| WO | WO-2019/239984 | | 12/2019 |

OTHER PUBLICATIONS

Written Opinion (Application No. PCT/IB2023/051254) Dated May 23, 2023.

Hamed.E et al., "Categorization and SEU Fault Simulations of Radiation-Hardened-by-Design Flip-Flops", Electronics, Jul. 1, 2021, vol. 10, No. 13, pp. 1572-1-1572-19, MDPI.

* cited by examiner

SEMICONDUCTOR DEVICE

TECHNICAL FIELD

One embodiment of the present invention relates to a semiconductor device and the like.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a storage device, a driving method thereof, and a manufacturing method thereof.

BACKGROUND ART

It is important for a semiconductor device such as a CPU to improve the reliability of data retained in a register or the like. Under an environment with intense radioactive rays, such as space, the data retained in the register or the like might be corrupted. In the case where the semiconductor device such as a CPU malfunctions due to the corrupted data, malfunction in control or the like of the semiconductor device might be caused.

As a technique for improving the reliability of data retained in a register, there is a structure where a majority circuit such as a Triple Module Redundancy (TMR) circuit is used. In the majority circuit, even when part of data retained in a plurality of registers is corrupted by radioactive rays or the like, data whose reliability is ensured can be output by majority decision making of the data retained in the plurality of registers.

For example, Patent Document 1 discloses a structure where data output from a register is output through a majority circuit.

REFERENCE

Patent Document

[Patent Document 1] Japanese Published Patent Application No. 2019-164472

SUMMARY OF THE INVENTION

Problems to be Solved by the Invention

In a majority circuit such as TMR, an increase in the number of registers can ensure data reliability. However, the increase in the number of registers causes a problem such as an increase in power consumption. In addition, in the case of being under an environment where radioactive rays are not intense, there is a problem such that the effectiveness of the majority circuit such as TMR is difficult to confirm.

One object of one embodiment of the present invention is to provide a novel semiconductor device or the like. Another object of one embodiment of the present invention is to provide a semiconductor device or the like having a novel structure that can inhibit an increase in power consumption. Another object of one embodiment of the present invention is to provide a semiconductor device or the like having a novel structure in which whether to execute a majority circuit or not can be selected.

Note that the objects of one embodiment of the present invention are not limited to the objects listed above. The objects listed above do not preclude the presence of other objects. Note that the other objects are objects that are not described in this section and will be described below. The objects that are not described in this section can be derived from the description of the specification, the drawings, and the like and can be extracted as appropriate from the description by those skilled in the art. Note that one embodiment of the present invention is to achieve at least one of the objects listed above and/or the other objects.

Means for Solving the Problems

One embodiment of the present invention is a semiconductor device that includes a first flip-flop having a function of retaining input data in response to a clock signal and outputting first output data in response to the input data; a second flip-flop having a function of retaining the input data in response to the clock signal and outputting second output data based on the input data; a third flip-flop having a function of retaining the input data in response to the clock signal and outputting third output data based on the input data; a majority circuit to which the first output data to the third output data are input and having a function of determining the most common logical value in the first output data to the third output data by majority decision making and outputting data of the determined logical value as fourth output data; and a switching circuit to which the first output data and the fourth output data are input and having a function of outputting output data based on the first output data or the fourth output data in response to a switching signal.

It is preferable that one embodiment of the present invention be a semiconductor device in which the switching signal is a signal output from a switching signal output circuit and the switching signal output circuit outputs a switching signal in response to an error detection signal of an error detection circuit.

It is preferable that one embodiment of the present invention be a semiconductor device in which the error detection circuit is a circuit detecting physical quantity corresponding to frequency of a soft error and the switching signal is a signal for selecting the first output data when the frequency of the soft error is low in the switching circuit and for selecting the fourth output data when the frequency of the soft error is high.

It is preferable that one embodiment of the present invention be a semiconductor device including a logic circuit having a function of controlling supply of the clock signal to the second flip-flop and the third flip-flop.

It is preferable that one embodiment of the present invention be a semiconductor device including a power switch having a function of stopping supply of power supply voltage to the second flip-flop and the third flip-flop. The power switch stops supply of power supply voltage to the second flip-flop and the third flip-flop when the first output data is selected as the output data in the switching circuit.

It is preferable that one embodiment of the present invention be a semiconductor device including a power switch having a function of stopping supply of power supply voltage to the second flip-flop, the third flip-flop, and the majority circuit. The power switch stops supply of power supply voltage to the second flip-flop, the third flip-flop, and the majority circuit when the first output data is selected as the output data in the switching circuit.

Note that other embodiments of the present invention are illustrated in the description of the following embodiments and the drawings.

Effect of the Invention

One embodiment of the present invention can provide a novel semiconductor device or the like. Another embodiment of the present invention can provide a semiconductor device or the like having a novel structure that can inhibit an increase in power consumption. Another embodiment of the present invention can provide a semiconductor device or the like having a novel structure in which whether to execute a majority circuit or not can be selected.

Note that the description of these effects does not preclude the presence of other effects. Note that one embodiment of the present invention does not need to have all these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
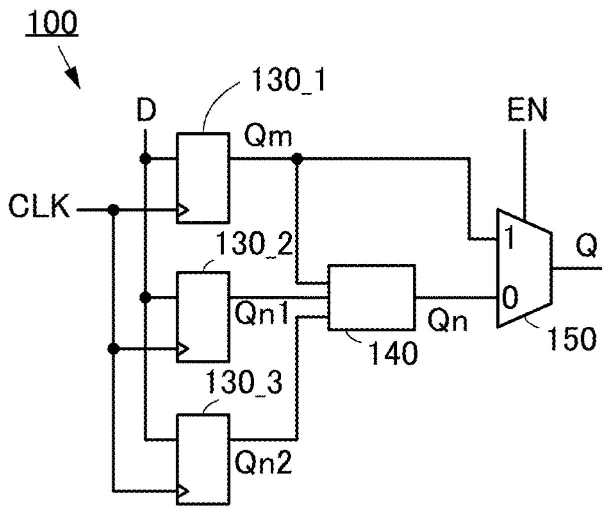
FIG. 1A and FIG. 1B are diagrams each illustrating a structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, the size, the layer thickness, or the region is not limited to the illustrated scale. Note that the drawings schematically illustrate ideal examples, and embodiments of the present invention are not limited to shapes, values, and the like illustrated in the drawings.

Furthermore, unless otherwise specified, off-state current in this specification and the like refers to drain current of a transistor in an off state (also referred to as a non-conduction state or a cutoff state). Unless otherwise specified, an off state in an n-channel transistor refers to a state where voltage $V_{gs}$ between its gate and source is lower than threshold voltage $V_{th}$ (in a p-channel transistor, higher than $V_{th}$).

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used for an active layer of a transistor, the metal oxide is referred to as an oxide semiconductor in some cases. That is, in the case where an OS transistor is stated, the OS transistor can also be referred to as a transistor including a metal oxide or an oxide semiconductor in a channel.

Embodiment 1

In this embodiment, structure examples of a semiconductor device will be described.

Structure Example of Semiconductor Device

FIG. 1A is a block diagram illustrating an example of a semiconductor device.

A semiconductor device 100 illustrated in FIG. 1A includes flip-flops 130_1 to 130_3, a majority circuit 140, and a switching circuit 150.

In the semiconductor device 100, input data D is retained in a plurality of flip-flops (for example, three flip-flops), flip-flops 130_1 to 130_3. Majority decision making on output data Qm, Qn1, and Qn2 in the flip-flops 130_1 to 130_3 is performed by the majority circuit 140. The majority circuit 140 outputs output data Qn. The switching circuit 150 outputs the output data Qm or the output data Qn as output data Q in response to a switching signal EN.

The flip-flops 130_1 to 130_3 retain the input data D in response to a clock signal CLK. The flip-flop 130_1 is referred to as a first flip-flop, a first data retention portion, or a first register in some cases. The flip-flop 130_2 is referred to as a second flip-flop, a second data retention portion, or a second register in some cases. The flip-flop 130_3 is referred to as a third flip-flop, a third data retention portion, or a third register in some cases.

The flip-flops 130_1 to 130_3 retain the output data Qm, Qn1, and Qn2 in response to the clock signal CLK. The output data Qm is referred to as first output data in some cases. The output data Qn1 is referred to as second output data in some cases. The output data Qn2 is referred to as third output data in some cases. The output data Qm is output to the majority circuit 140 and the switching circuit 150. The output data Qn1 and Qn2 are output to the majority circuit 140.

The majority circuit 140 outputs the output data Qn subjected to majority decision making on the basis of logical values of the output data Qm, Qn1, and Qn2. Specifically, the most common logical value among the output data Qm, Qn1, and Qn2 is determined by majority decision making, and data of the determined logical value is output as the output data Qn. The output data Qn is referred to as fourth output data in some cases. The output data Qn is output to the switching circuit 150.

The switching circuit 150 outputs one of the output data Qm and Qn as the output data Q in response to the switching signal EN. The output data Q is output to a circuit in a subsequent stage.

Note that for the flip-flops 130_1 to 130_3, a structure where two inverter circuits are used, a structure where a clocked inverter is used, a structure where a NAND circuit and an inverter are combined, or the like can be used as appropriate. For example, a known flip-flop such as an RS flip-flop, a JK flip-flop, a D flip-flop, or a T flip-flop can be used as appropriate.

With the structure in FIG. 1A, when a soft error in which data is inverted by radiation energy, such as SEU (Single Event Upset), occurs in one flip-flop, data inversion caused by the soft error can be corrected. In addition, in the structure in FIG. 1A, stopping the functions of the flip-flops 130_2 and 130_3 or stopping the function of the majority circuit 140, and switching the switching circuit 150 so that the output data Qm in the flip-flop 130_1 is used as the output data Q can inhibit an increase in power consumption. That is, when the structure in FIG. 1A is a structure where the output data Qm in the flip-flop 130_1 and the output data Qn in the majority circuit are switched by the switching circuit 150, whether to execute the majority circuit 140 or not can be selected. Therefore, in the case where the soft error does not easily occur, an increase in power consumption can be inhibited because it is possible to employ a structure where only a necessary circuit is operated by switching when the soft error is evaluated, for example.

The switching signal EN supplied to the switching circuit can have a structure for switching the output data Qm or the output data Qn in accordance with the frequency of the soft error. For example, the functions of the flip-flops 130_2 and 130_3 and the majority circuit 140 are set in an active state and the output data Qn obtained by the majority circuit 140 is used as the output data Q in the case where the frequency of the soft error is high, and the functions of the flip-flops 130_2 and 130_3 and the majority circuit 140 are set in an inactive state and the output data Qm obtained by the flip-flop 130_1 is used as the output data Q in the case where the frequency of the soft error is low.

Figure 1B:
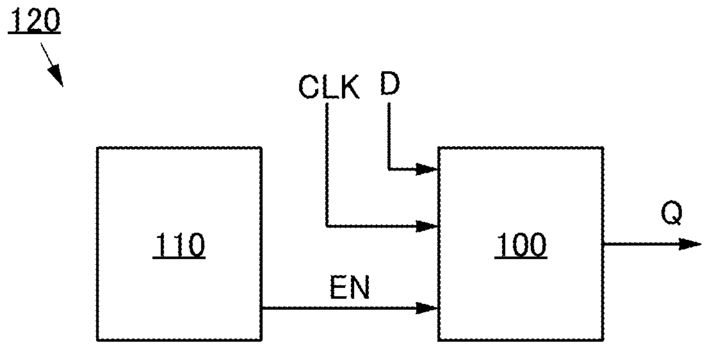

FIG. 1B illustrates a block diagram of a multiplex data control system 120 including the semiconductor device 100. In the multiplex data control system 120, a switching signal output circuit 110 outputs the switching signal EN to the semiconductor device 100 in response to an error detection signal. The error detection signal is a signal based on detection of a soft error of an error detection circuit. The error detection circuit detects physical quantity corresponding to the frequency of the soft error, such as intensity of radioactive rays, with a sensor or the like, and the detected value may be used for the presence or absence of the error detection signal.

With the structures in FIG. 1A and FIG. 1B, when the soft error in which data is inverted by radiation energy, such as SEU (Single Event Upset), occurs in one flip-flop, data inversion caused by the soft error can be corrected and data reliability can be ensured. In addition, in the structures in FIG. 1A and FIG. 1B, stopping the functions of the flip-flops 130_2 and 130_3 or the function of the majority circuit 140 and switching the switching circuit 150 so that the output data Qm in the flip-flop 130_1 is used as the output data Q can inhibit an increase in power consumption. That is, when each of the structures in FIG. 1A and FIG. 1B is a structure where the output data Qm in the flip-flop 130_1 and the output data Qn in the majority circuit 140 are switched by the switching circuit 150, whether to execute the majority circuit 140 or not can be selected. Therefore, in the case where the soft error does not easily occur, an increase in power consumption can be inhibited because it is possible to employ a structure where only a necessary circuit is operated by switching when the soft error is evaluated, for example. Furthermore, by outputting the output data Qm of the flip-flop 130_1 and the output data Qn of the majority circuit to the outside as the output data Q, the effectiveness of the majority circuit 140 can be confirmed.

Figure 2A:
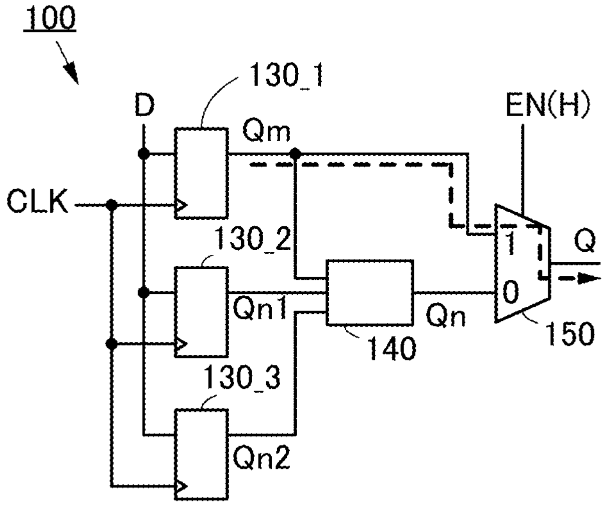
FIG. 2A and FIG. 2B are diagrams each illustrating a structure example of the semiconductor device.
Figure 2B:
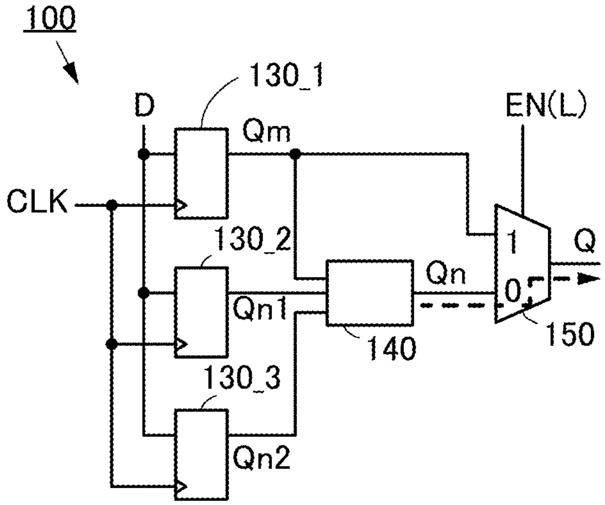

FIG. 2A and FIG. 2B are schematic diagrams for illustrating the operation of the structures in FIG. 1A and FIG. 1B. In FIG. 2A and FIG. 2B, dotted arrows schematically represent the flow of output data that is switched as the output data Q.

FIG. 2A illustrates a structure where the switching signal EN is set to an H level (H or "1") and the output data Qm of the flip-flop 130_1 is output to the outside as the output data Q, for example. In addition, FIG. 2B illustrates a structure where the switching signal EN is set to an L level (L or "0") and the output data Qn obtained by majority decision making in the majority circuit 140 is output to the outside as the output data Q, for example.

Figure 3A:
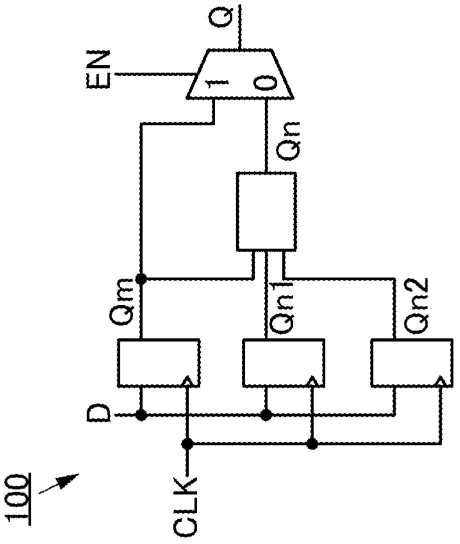
FIG. 3A to FIG. 3F are diagrams illustrating structure examples of the semiconductor device.
Figure 3B:
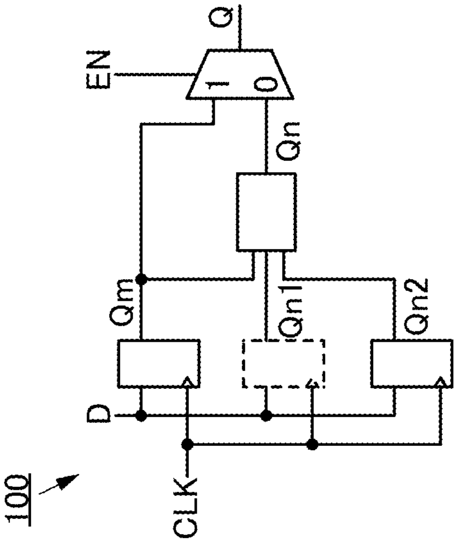
Figure 3C:
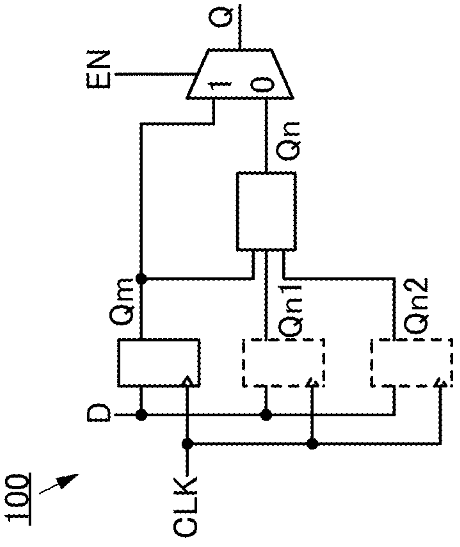

In addition, FIG. 3A to FIG. 3C are diagrams each schematically illustrating the presence or absence of a soft error caused in the flip-flops 130_1 to 130_3. FIG. 3A illustrates a state where data retained in the flip-flops 130_1 to 130_3 has no soft error. FIG. 3B illustrates a state where data retained in the flip-flop 130_2 has a soft error (the flip-flop is represented by a broken line). FIG. 3C illustrates a state where data retained in the flip-flops 130_2 and 130_3 has a soft error (the flip-flops are each represented by a broken line).

Figure 3D:
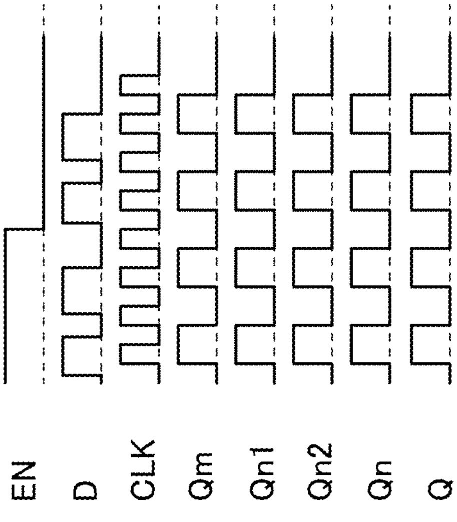
Figure 3E:
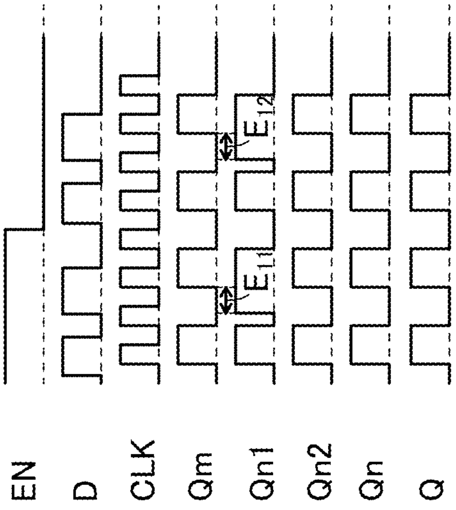
Figure 3F:
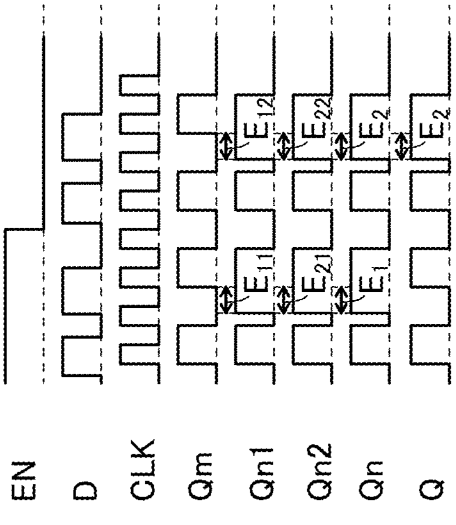

FIG. 3D to FIG. 3F are timing charts of the input data D, the output data Qm, Qn1, Qn2, Qn, and Q, the switching signal EN, and the clock signal CLK that correspond to FIG. 3A to FIG. 3C. Note that the output data Qm of the flip-flop 130_1 is output to the outside as the output data Q in the case where the switching signal EN is at an H level (H), and the output data Qn obtained by majority decision making in the majority circuit 140 is output to the outside as the output data Q in the case where the switching signal EN is at an L level (L).

In the case where the data retained in the flip-flops 130_1 to 130_3 illustrated in FIG. 3A has no soft error, in the timing chart of FIG. 3D, waveforms of output signals corresponding to output signals of the flip-flops 130_1 to 130_3 can be output regardless of switching of the switching signal EN.

In the case where the data retained in the flip-flop 130_2 illustrated in FIG. 3B has a soft error, in the timing chart of FIG. 3E, waveforms of output signals corresponding to the output signals of the flip-flops 130_1 to 130_3 can be output regardless of switching of the switching signal EN. In the timing chart of FIG. 3E, periods during which the logical value of data that should be originally retained in the flip-flop 130_2 is inverted due to the soft error are denoted by $E_{11}$ and $E_{12}$. When the majority circuit 140 functions, waveforms of desired output signals can be output even in the case where the switching signal EN is at an L level.

In the case where the data retained in the flip-flops 130_2 and 130_3 illustrated in FIG. 3C has a soft error, in the timing chart of FIG. 3F, a data signal of the soft error that is retained in the flip-flops 130_2 and 130_3 is output as an output signal by switching of the switching signal EN. In the timing chart of FIG. 3F, periods during which the logical value of data that should be originally retained in the flip-flop 130_2 is inverted due to the soft error are denoted by $E_{11}$ and $E_{12}$. In addition, in the timing chart of FIG. 3F, periods during which the logical value of data that should be originally retained in the flip-flop 130_3 is inverted due to the soft error are denoted by $E_{21}$ and $E_{22}$. A period during which the logical value of the output data Qn is inverted due to the soft error in the periods $E_{11}$ and $E_{21}$ is denoted by $E_1$. A period during which the logical value of the output data Qn is inverted due to the soft error in the periods $E_{12}$ and $E_{22}$ is denoted by $E_2$. A soft error that appears in the output data Q appears in the period $E_2$ in a period during which the switching signal EN is at an L level.

In the case where no signals of the majority circuit 140 are needed as in FIG. 3A and FIG. 3D, a structure where the switching signal EN is switched to select the output data Qm and the flip-flops 130_2 and 130_3 and the majority circuit 140 are clock-gated or power-gated is effective in reducing power consumption. In addition, in the case where signals of the majority circuit 140 are effective as in FIG. 3B and FIG. 3E, a structure where the switching signal EN is switched to select the output data Qn and output data of the majority circuit 140 is output is effective in ensuring data reliability. Furthermore, in the case where signals of the majority circuit 140 are not effective as in FIG. 3C and FIG. 3F, a structure where the number of flip-flops retaining input data is increased is effective in ensuring data reliability.

Figure 4A:
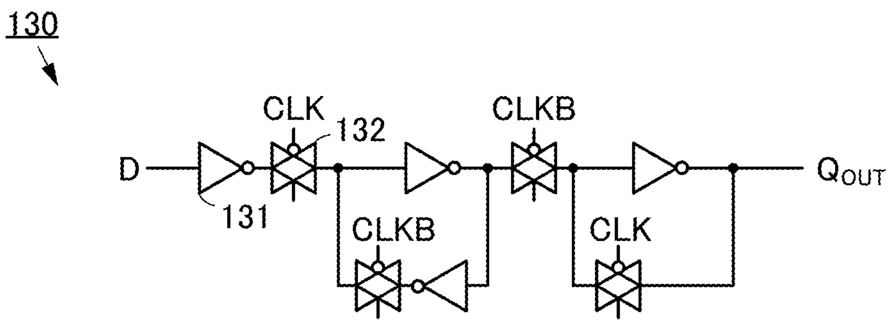
FIG. 4A and FIG. 4B are diagrams each illustrating a structure example of the semiconductor device.

FIG. 4A is a structure example of the flip-flop 130 applicable to the flip-flops 130_1 to 130_3. FIG. 4A illustrates a structure example where an inverter 131 and a clocked inverter 132 are combined. Note that an inverted clock signal CLKB is an inverted signal of the clock signal CLK, and output data $Q_{OUT}$ is output data of the flip-flop 130.

Figure 4B:
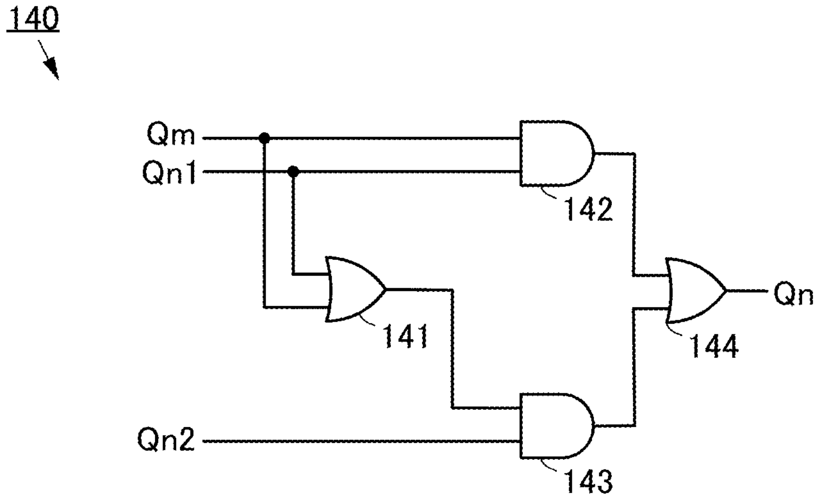

FIG. 4B is a structure example applicable to the majority circuit 140. The majority circuit 140 illustrated in FIG. 4B includes an OR circuit 141, an AND circuit 142, an AND circuit 143, and an OR circuit 144. With this structure, the output data Qn obtained by majority decision making of the logical values of the output data Qm, Qn1, and Qn2 can be obtained.

Modification Example 1 of Semiconductor Device

Figure 5A:
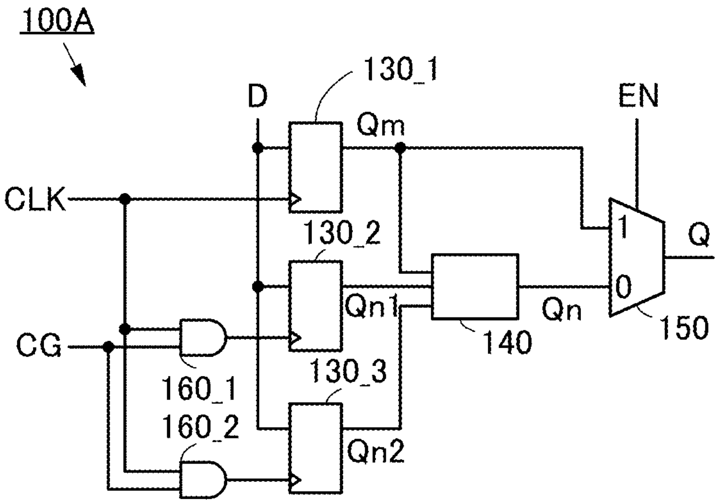
FIG. 5A and FIG. 5B are diagrams illustrating a structure example of a semiconductor device.

FIG. 5A is a block diagram illustrating a semiconductor device 100A that is a modification example of the semiconductor device 100.

FIG. 5A includes logic circuits 160_1 and 160_2 that function as AND circuits to which the clock signal CLK and a control signal CG are input in the block diagram of FIG. 1A. Output signals of the logic circuits 160_1 and 160_2 are input to the flip-flops 130_2 and 130_3, respectively. Although the two logic circuits 160_1 and 160_2 are illustrated, branching or the like of output signals allows one logic circuit.

The control signal CG is a signal for controlling clock gating of the flip-flops 130_2 and 130_3.

Figure 5B:
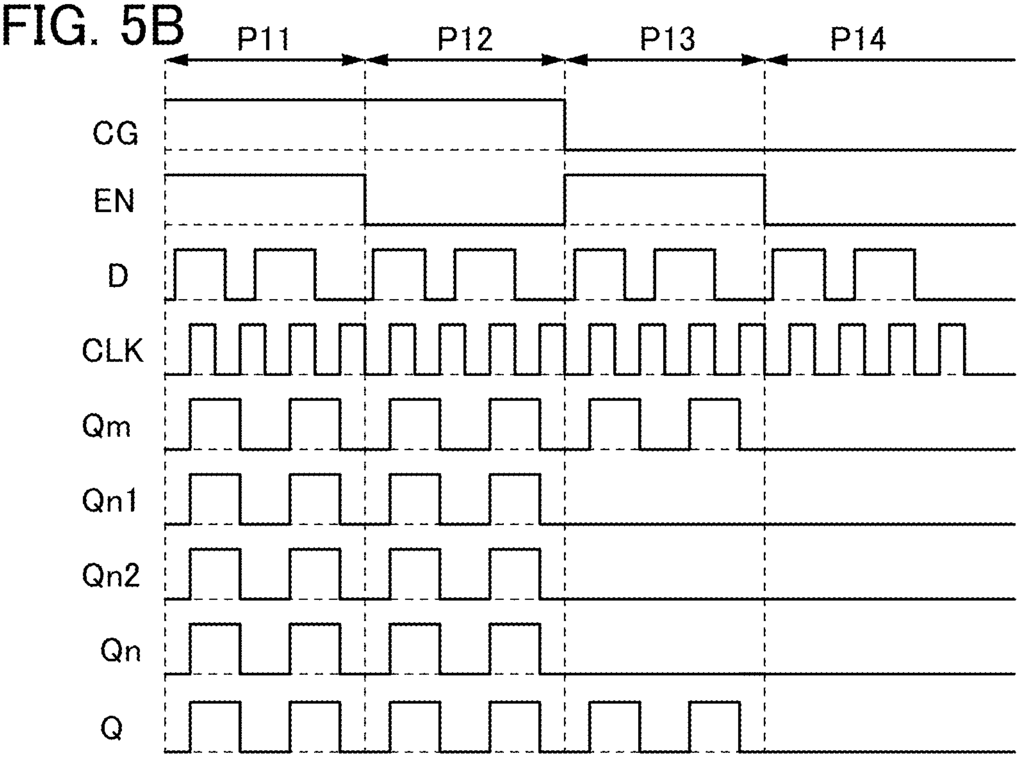

FIG. 5B is a timing chart for showing an operation example of the semiconductor device 100A illustrated in FIG. 5A. In FIG. 5B, at an H level, the control signal CG supplied to the logic circuits 160_1 and 160_2 is controlled so that the clock signal CLK is supplied to the flip-flops 130_2 and 130_3. In addition, at an L level, in FIG. 5B, the control signal CG supplied to the logic circuits 160_1 and 160_2 is controlled so that the clock signal CLK supplied to the flip-flops 130_2 and 130_3 is interrupted. In the flip-flops 130_2 and 130_3 where the clock signal CLK is interrupted, the output data Qn1 and Qn2 are set to an L level, and charging and discharging of electric charge at the time of outputting output data are inhibited; thus, low power consumption is achieved.

When the control signal CG is set to an H level and the switching signal EN is set to an H level (a period P11 in FIG. 5B), the output data Qm, Qn1, and Qn2 corresponding to the input data D are obtained. The output data Qm of the flip-flop 130_1 is selected as the output data Q by the switching signal EN. Thus, this structure is effective in ensuring data reliability.

When the control signal CG is set to an H level and the switching signal EN is set to an L level (a period P12 in FIG. 5B), the output data Qm, Qn1, and Qn2 corresponding to the input data D are obtained. The output data Qn obtained by the majority circuit 140 using the output data Qm, Qn1, and Qn2 is selected as the output data Q by the switching signal EN. In this case, since the output data Qm and the output data Qn are the same data, the output data Qm is preferably selected as the output data Q by the switching circuit 150. When the output data Qm is selected as the output data Q by the switching circuit 150, the output data Qn of the majority circuit 140 that is obtained using the output data Qn1 and Qn2 becomes unnecessary. Thus, stopping the functions of the flip-flops 130_2 and 130_3 and performing control to set the output data Qn1 and Qn2 to an L level are effective in achieving low power consumption.

When the control signal CG is set to an L level and the switching signal EN is set to an H level (a period P13 in FIG. 5B), the output data Qm corresponding to the input data D is obtained. The output data Qn1 and Qn2 are set to an L level by clock gating of the flip-flops 130_2 and 130_3. Thus, the output data Qn of the majority circuit 140 is also set to an L level. Since the output data Qm is selected as the output data Q by the switching circuit 150, stopping the functions of the flip-flops 130_2 and 130_3 and performing control to set the output data Qn1, Qn2, and Qn to an L level as well as outputting normal output data are effective in achieving low power consumption.

When the control signal CG is set to an L level and the switching signal EN is set to an L level (a period P14 in FIG. 5B), the output data Qn corresponding to the output data of the clock-gated flip-flops 130_2 and 130_3 is selected. Since the output data Qn is at an L level, the output data Q is also set to an L level.

With structures in FIG. 5A and FIG. 5B, when the soft error in which data is inverted by radiation energy, such as SEU, occurs in one flip-flop, data inversion caused by the soft error can be corrected and data reliability can be ensured. In addition, in the structures in FIG. 5A and FIG.

5B, stopping the functions of the flip-flops 130_2 and 130_3 by clock gating and switching the switching circuit 150 so that the output data Qm is used as the output data Q can achieve low power consumption. Therefore, in the case where the soft error does not easily occur, an increase in power consumption can be inhibited because it is possible to employ a structure where only a necessary circuit is operated by switching when the soft error is evaluated, for example. Furthermore, by outputting the output data Qm of the flip-flop 130_1 and the output data Qn of the majority circuit to the outside as the output data Q, the effectiveness of the majority circuit 140 can be confirmed.

Modification Example 2 of Semiconductor Device

Figure 6A:
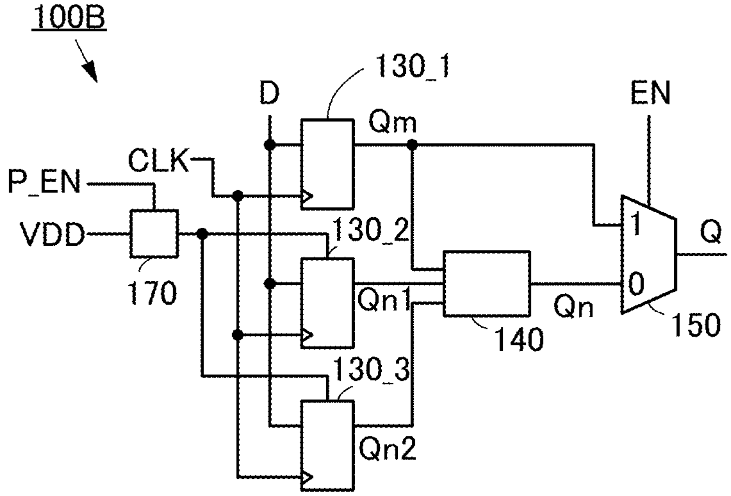
FIG. 6A and FIG. 6B are diagrams illustrating a structure example of a semiconductor device.

FIG. 6A is a block diagram illustrating a semiconductor device 100B that is a modification example of the semiconductor device 100.

FIG. 6A includes a power switch 170 through which supply of power supply voltage VDD is controlled by a control signal P_EN in the block diagram of FIG. 1A. The power supply voltage VDD supplied through the power switch 170 is supplied to the flip-flops 130_2 and 130_3.

The control signal P_EN is a signal for controlling supply of the power supply voltage VDD to the flip-flops 130_2 and 130_3, that is, power gating.

Figure 6B:
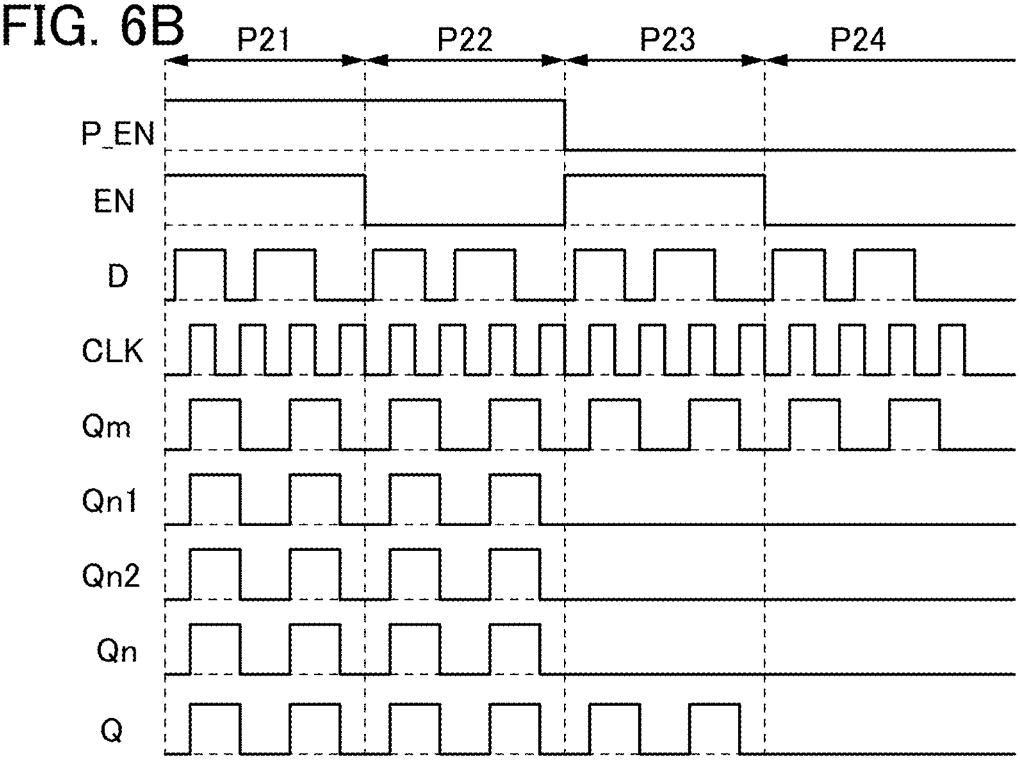

FIG. 6B is a timing chart for showing an operation example of the semiconductor device 100B illustrated in FIG. 6A. In FIG. 6B, at an H level, the control signal P_EN supplied to the power switch 170 is controlled so that the power supply voltage VDD is supplied to the flip-flops 130_2 and 130_3. In addition, in FIG. 6B, at an L level, the control signal P_EN supplied to the power switch 170 is controlled so that the power supply voltage VDD supplied to the flip-flops 130_2 and 130_3 is interrupted. In the flip-flops 130_2 and 130_3 where the supply of the power supply voltage VDD is interrupted, the output data Qn1 and Qn2 are set to an L level, and charging and discharging of electric charge at the time of outputting output data are inhibited; thus, low power consumption is achieved.

When the control signal P_EN is set to an H level and the switching signal EN is set to an H level (a period P21 in FIG. 6B), the output data Qm, Qn1, and Qn2 corresponding to the input data D are obtained. The output data Qm of the flip-flop 130_1 is selected as the output data Q by the switching signal EN. Thus, this structure is effective in ensuring data reliability.

When the control signal P_EN is set to an H level and the switching signal EN is set to an L level (a period P22 in FIG. 6B), the output data Qm, Qn1, and Qn2 corresponding to the input data D are obtained. The output data Qn obtained by the majority circuit 140 using the output data Qm, Qn1, and Qn2 is selected as the output data Q by the switching signal EN. In this case, since the output data Qm and the output data Qn are the same data, the output data Qm is preferably selected as the output data Q by the switching circuit 150. When the output data Qm is selected as the output data Q by the switching circuit 150, the output data Qn of the majority circuit 140 that is obtained using the output data Qn1 and Qn2 becomes unnecessary. Thus, stopping the functions of the flip-flops 130_2 and 130_3 and performing control to set the output data Qn1 and Qn2 to an L level are effective in achieving low power consumption.

When the control signal P_EN is set to an L level and the switching signal EN is set to an H level (a period P23 in FIG. 6B), the output data Qm corresponding to the input data D is obtained. The output data Qn1 and Qn2 are set to an L level by power gating of the flip-flops 130_2 and 130_3. Thus, the output data Qn of the majority circuit 140 is also set to an L level. The output data Qm is selected as the output data Q by the switching circuit 150. Thus, stopping the functions of the flip-flops 130_2 and 130_3 and performing control to set the output data Qn1 and Qn2 to an L level as well as outputting normal output data are effective in achieving low power consumption.

When the control signal P_EN is set to an L level and the switching signal EN is set to an L level (a period P24 in FIG. 6B), the output data Qn corresponding to the output data of the power-gated flip-flops 130_2 and 130_3 is selected. Since the output data Qn is at an L level, the output data Q is also set to an L level.

With structures in FIG. 6A and FIG. 6B, when the soft error in which data is inverted by radiation energy, such as SEU, occurs in one flip-flop, data inversion caused by the soft error can be corrected and data reliability can be ensured. In addition, in the structures in FIG. 6A and FIG. 6B, stopping the functions of the flip-flops 130_2 and 130_3 by power gating and switching the switching circuit 150 so that the output data Qm is used as the output data Q can achieve low power consumption. Therefore, in the case where the soft error does not easily occur, an increase in power consumption can be inhibited because it is possible to employ a structure where only a necessary circuit is operated by switching when the soft error is evaluated, for example. Furthermore, by outputting the output data Qm of the flip-flop 130_1 and the output data Qn of the majority circuit to the outside as the output data Q, the effectiveness of the majority circuit 140 can be confirmed.

Modification Example 3 of Semiconductor Device

Figure 7A:
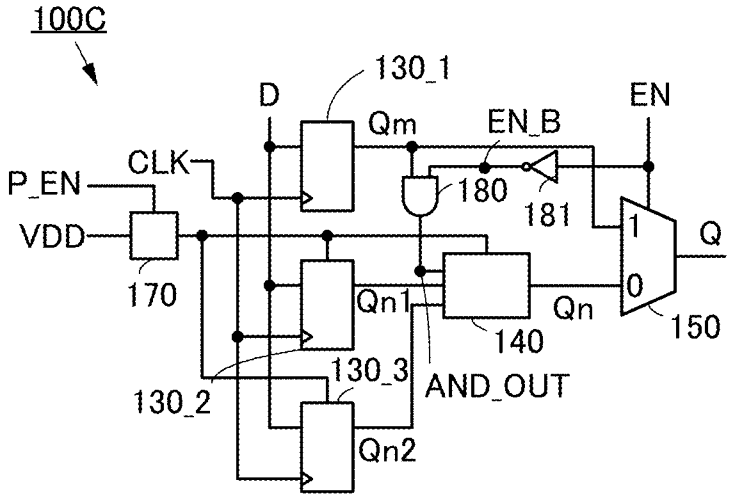
FIG. 7A and FIG. 7B are diagrams illustrating a structure example of a semiconductor device.

FIG. 7A is a block diagram illustrating a semiconductor device 100C that is a modification example of the semiconductor device 100.

In FIG. 7A, the power supply voltage VDD supplied through the power switch 170 is supplied to the flip-flops 130_2 and 130_3 and the majority circuit 140 in the block diagram of FIG. 6A. A logic circuit 180 that functions as an AND circuit to which the output data Qm and an inverted signal of the switching signal EN are input is included. In addition, the inverted signal of the switching signal EN can be supplied through a logic circuit 181 that functions as a NOT circuit.

Figure 7B:
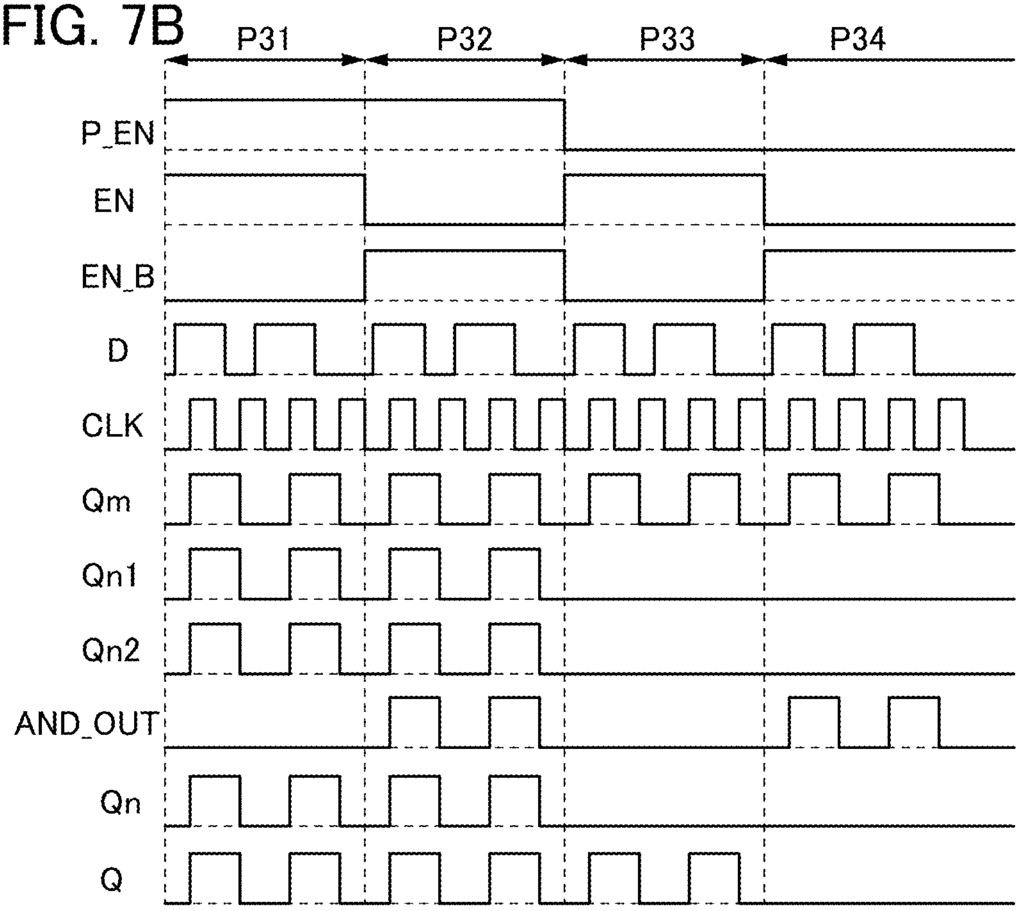

FIG. 7B is a timing chart for showing an operation example of the semiconductor device 100C illustrated in FIG. 7A. In FIG. 7B, at an H level, the control signal P_EN supplied to the power switch 170 is controlled so that the power supply voltage VDD is supplied to the flip-flops 130_2 and 130_3 and the majority circuit 140. In addition, in FIG. 7B, at an L level, the control signal P_EN supplied to the power switch 170 is controlled so that the power supply voltage VDD supplied to the flip-flops 130_2 and 130_3 and the majority circuit 140 is interrupted. In the flip-flops 130_2 and 130_3 and the majority circuit 140 where the supply of the power supply voltage VDD is interrupted, the output data Qn1, Qn2, and Qn are set to an L level, and charging and discharging of electric charge at the time of outputting output data are inhibited; thus, low power consumption is achieved.

In addition, FIG. 7B illustrates the output of the logic circuit 181 that outputs the inverted signal of the switching signal EN as an inverted switching signal EN_B. Furthermore, FIG. 7B illustrates the output of the logic circuit 181 to which the output data Qm and the inverted switching signal EN_B are input as an output signal AND_OUT.

When the control signal P_EN is set to an H level and the switching signal EN is set to an H level (a period P31 in FIG. 7B), the output data Qm, Qn1, and Qn2 corresponding to the input data D are obtained. The output data Qm of the flip-flop 130_1 is selected as the output data Q by the switching signal EN. Thus, this structure is effective in ensuring data reliability. Note that the output data Qm is input to the majority circuit 140 as an L-level signal because the switching signal EN_B is at an L level.

When the control signal P_EN is set to an H level and the switching signal EN is set to an L level (a period P32 in FIG. 7B), the output data Qm, Qn1, and Qn2 corresponding to the input data D are obtained. The output data Qn obtained by the majority circuit 140 using the output data Qn1 and Qn2 is selected as the output data Q by the switching signal EN. The output signal AND_OUT can have the same logical value as the output data Qm because the switching signal EN_B is at an H level. Thus, the logical value of the output data Qm is input to the majority circuit 140.

When the control signal P_EN is set to an L level and the switching signal EN is set to an H level (a period P33 in FIG. 7B), the output data Qm corresponding to the input data D is obtained. The output data Qn1, Qn2, and Qn are set to an L level by power gating of the flip-flops 130_2 and 130_3 and the majority circuit 140. Since the output data Qm is selected as the output data Q by the switching circuit 150, power consumption can be reduced by performing control to stop the output data Qn1, Qn2, and Qn as well as outputting normal output data. Note that the output data Qm is input to the majority circuit 140 as an L-level signal because the switching signal EN_B is at an L level. With this structure, latch up at the time of power gating of the majority circuit 140 can be inhibited.

When the control signal P_EN is set to an L level and the switching signal EN is set to an L level (a period P34 in FIG. 7B), the output data Qn corresponding to the output data of the power-gated flip-flops 130_2 and 130_3 and the majority circuit 140 is selected. Since the output data Qn is at an L level, the output data Q is also set to an L level. The output signal AND_OUT can have the same logical value as the output data Qm because the switching signal EN_B is at an H level. However, output signals Qn and Q are each set to an L level because the majority circuit 140 is power-gated. Note that the logic circuits 180 and 181 are also power-gated at the same timing as the majority circuit 140, so that the output signal AND_OUT can be set to an L level.

With structures in FIG. 7A and FIG. 7B, when a soft error in which data is inverted by radiation energy, such as SEU, occurs in one flip-flop, data inversion caused by the soft error can be corrected and data reliability can be ensured. In addition, in the structures in FIG. 7A and FIG. 7B, including the logic circuit 180 can inhibit latch up in the majority circuit 140. Stopping the functions of the flip-flops 130_2 and 130_3 and the majority circuit 140 and switching the switching circuit 150 so that the output data Qm is used as the output data Q can achieve low power consumption. Therefore, in the case where the soft error does not easily occur, an increase in power consumption can be inhibited because it is possible to employ a structure where only a necessary circuit is operated by switching when the soft error is evaluated, for example. Furthermore, by outputting the output data Qm of the flip-flop 130_1 and the output data Qn of the majority circuit to the outside as the output data Q, the effectiveness of the majority circuit 140 can be confirmed.

In the structures according to one embodiment of the present invention as described above, when a soft error in which data is inverted occurs in one flip-flop, data inversion caused by the soft error can be corrected and data reliability can be ensured. In addition, stopping the functions of the flip-flops 130_2 and 130_3 or stopping the function of the majority circuit 140, and switching the switching circuit 150 so that the output data Qm in the flip-flop 130_1 is used as the output data Q can inhibit an increase in power consumption. Furthermore, by outputting the output data Qm of the flip-flop 130_1 and the output data Qn of the majority circuit to the outside as the output data Q, the effectiveness of the majority circuit 140 can be confirmed.

Embodiment 2

In this embodiment, an example is described in which a semiconductor device applicable to the memory circuit described in the above embodiment, such as a register, is applied to another device. The semiconductor device described in this embodiment is applicable to an arithmetic device such as a CPU capable of operating with extremely low power consumption.

Figure 8:
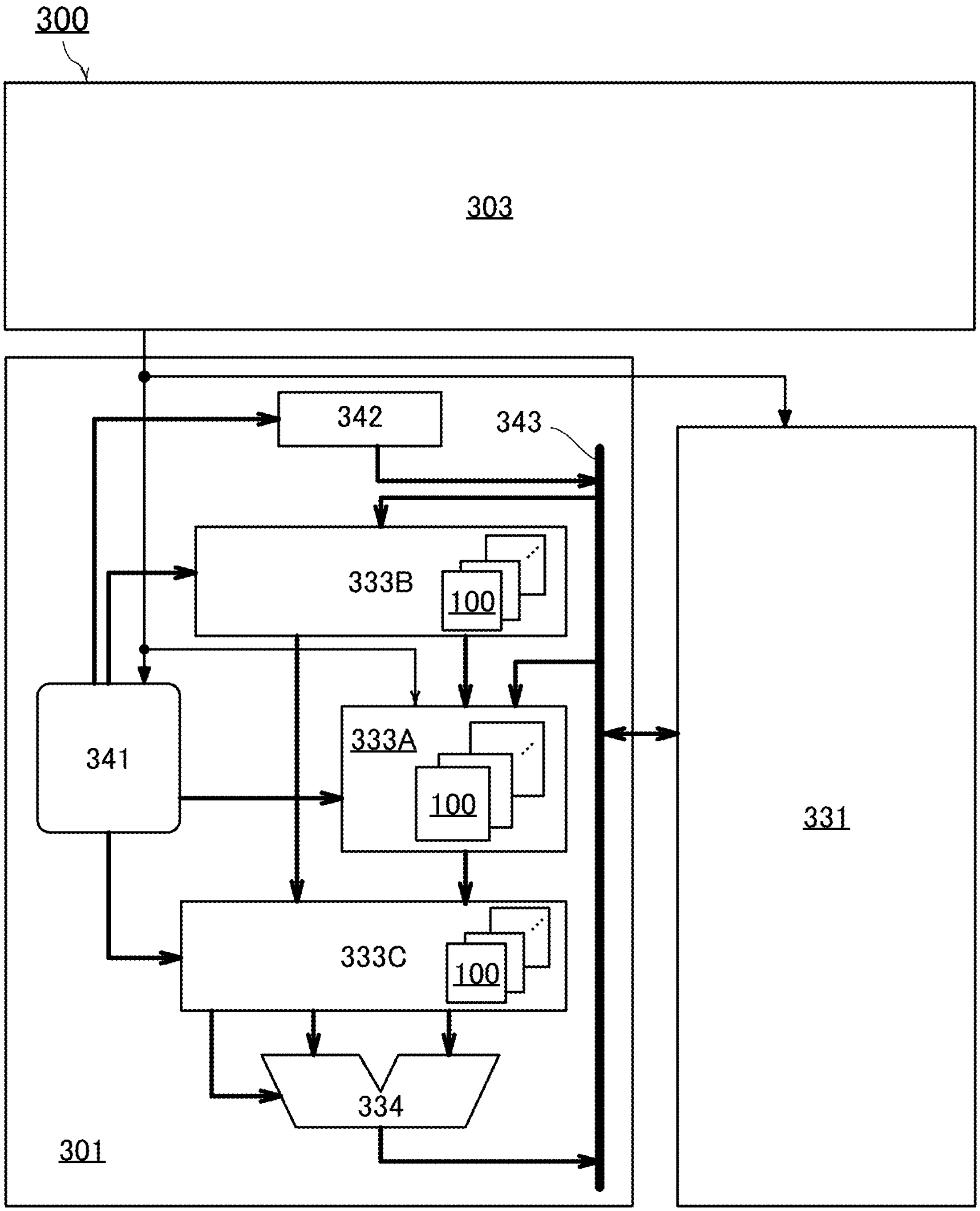
FIG. 8 is a diagram illustrating a structure example of a semiconductor device.

FIG. 8 is a block diagram illustrating a structure example of the case of applying the above semiconductor device 100 to each register included in a CPU core. An arithmetic device 300 illustrated in FIG. 8 illustrates a CPU core 301, a PMU 303 (power management unit), and a memory device 331. The CPU core 301 includes a control circuit 341, a PC (program counter) 342, a register file 333A, a pipeline register 333B, a pipeline register 333C, a bus interface 343, and an arithmetic portion 334 (also referred to as an ALU). The semiconductor device 100 is applicable to a general-purpose register in the register file 333A, the pipeline register 333B, the pipeline register 333C, or the like. In the register file 333A, a plurality of semiconductor devices 100 form a general-purpose register, and a plurality of general-purpose registers form a plurality of register banks.

Note that when not only the registers in the register file but also the pipeline registers include the semiconductor devices 100, the reliability of data retained in the semiconductor devices 100 that function as registers in the arithmetic device 300 can be increased.

The control circuit 341 has functions of decoding an instruction contained in a program such as an input application and executing the instruction by comprehensively controlling the operation of the PC 342, the register file 333A, the pipeline register 333B, the pipeline register 333C, the arithmetic portion 334, the memory device 331, and the bus interface 343.

The control circuit 341 is provided with a memory circuit having a function of storing a program such as an application formed of a plurality of instructions executed by the control circuit 341 and data used for arithmetic processing in the arithmetic portion 334.

The PC 342 is a register having a function of storing the address of an instruction to be executed next. The pipeline register 333B has a function of temporarily storing frequently-used instructions among instructions (programs) used in the control circuit 341.

The register file 333A includes a plurality of semiconductor devices 100 that form a general-purpose register, and can store data read from the control circuit 341, data obtained in the middle of the arithmetic processing in the arithmetic portion 334, data obtained as a result of the arithmetic processing in the arithmetic portion 334, or the like.

In the pipeline register 333C, the semiconductor devices 100 can be employed for registers each having a function of temporarily storing data obtained in the middle of the arithmetic processing in the arithmetic portion 334, data obtained as a result of the arithmetic processing in the arithmetic portion 334, or the like. In addition, the pipeline register 333C may have a function of temporarily storing a program such as an application.

The bus interface 343 has a function of a data path between the CPU core 301 and a variety of devices outside the CPU core 301, such as the memory device 331.

A CPU structure example is described. In particular, an example of a CPU 310 including the CPU core 301 capable of power gating is described.

Figure 9:
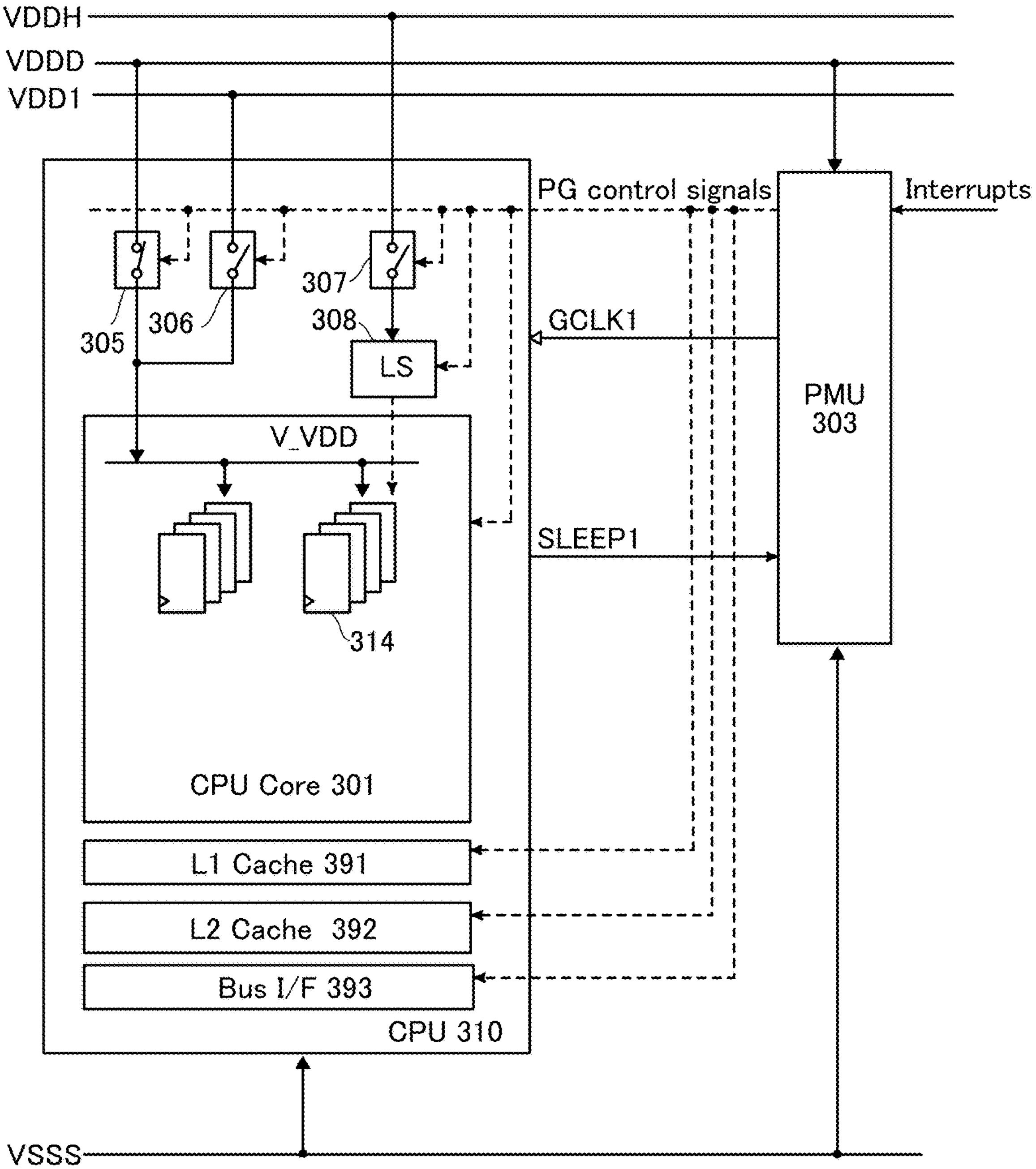
FIG. 9 is a diagram illustrating a structure example of a CPU.

FIG. 9 shows a structure example of the CPU 310. The CPU 310 includes a CPU core 301, an L1 (level 1) cache memory device (L1 Cache) 391, an L2 cache memory device (L2 Cache) 392, a bus interface portion (Bus I/F) 393, power switches 305 to 307, and a level shifter (LS) 308. The CPU core 301 includes flip-flops 314. The semiconductor devices 100 described in Embodiment 1 can be employed for the flip-flops 314.

Through the bus interface portion 393, the CPU core 301, the L1 cache memory device 391, and the L2 cache memory device 392 are connected to one another.

The PMU 303 generates a clock signal GCLK1 and a variety of PG (power gating) control signals in response to signals such as interrupt signals (Interrupts) input from the outside and a signal SLEEP1 issued from the CPU 310. The clock signal GCLK1 and the PG control signal are input to the CPU 310. The PG control signal controls the power switches 305 to 307 and the flip-flops 314.

The power switches 305 and 306 control supply of voltages VDDD and VDD1 to a virtual power supply line V_VDD (hereinafter referred to as a V_VDD line), respectively. The power switch 307 controls supply of voltage VDDH to the level shifter (LS) 308. Voltage VSSS is input to the CPU 310 and the PMU 303 not through the power switches. The voltage VDDD is input to the PMU 303 not through the power switches.

The voltages VDDD and VDD1 are drive voltages for a CMOS circuit. The voltage VDD1 is lower than the voltage VDDD and is drive voltage in a sleep state. The voltage VDDH is drive voltage for an OS transistor and is higher than the voltage VDDD.

The L1 cache memory device 391, the L2 cache memory device 392, and the bus interface portion 393 each include at least one power domain capable of power gating. The power domain capable of power gating is provided with one or more power switches. These power switches are controlled by the PG control signal.

The flip-flop 314 is used for a register. The flip-flop 314 is provided with a backup circuit. The flip-flop 314 is described below.

Figure 10A:
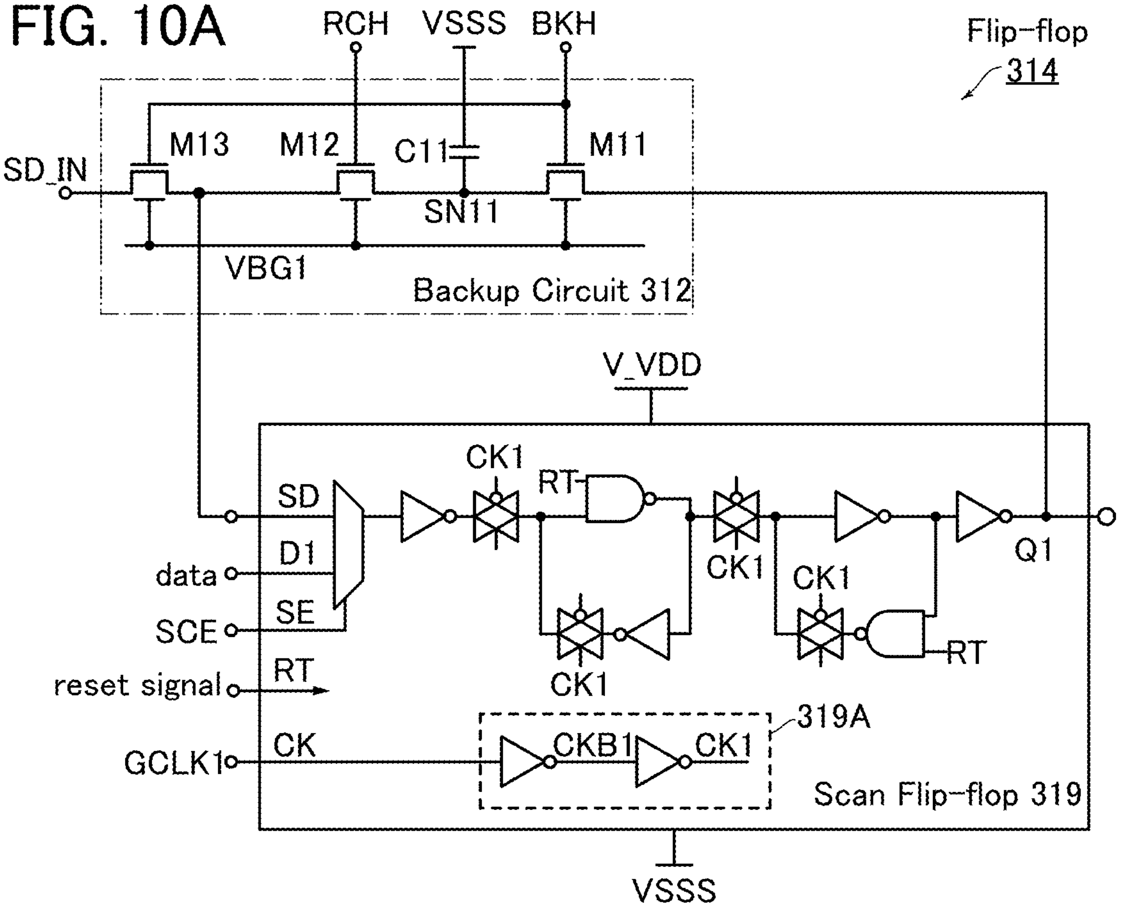
FIG. 10A and FIG. 10B are diagrams each illustrating a structure example of a CPU.

FIG. 10A illustrates a circuit structure example of the flip-flop 314. The flip-flop 314 includes a scan flip-flop 319 and a backup circuit 312.

The scan flip-flop 319 includes a node D1, a node Q1, a node SD, a node SE, a node RT, a node CK, and a clock buffer circuit 319A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 319A. Analog switches in the scan flip-flop 319 are connected to nodes CK1 and CKB1 of the clock buffer circuit 319A. The node RT is a reset signal input node.

The signal SCE is a scan enable signal and is generated in the PMU 303. The PMU 303 generates signals BK and RC. The level shifter 308 level-shifts the signals BK and RC to generate signals BKH and RCH. The signal BK is a backup signal, and the signal RC is a recovery signal.

A circuit structure of the scan flip-flop 319 is not limited to that in FIG. 10A. A flip-flop prepared in a standard circuit library can be employed.

The backup circuit 312 includes nodes SD_IN and SN11, transistors M11 to M13, and a capacitor C11.

The node SD_IN is a scan test data input node and is connected to the node Q1 of the scan flip-flop 319. The node SN11 is a retention node of the backup circuit 312. The capacitor C11 is a storage capacitor for retaining the voltage of the node SN11.

The transistor M11 controls a conduction state between the node Q1 and the node SN11. The transistor M12 controls a conduction state between the node SN11 and the node SD. The transistor M13 controls a conduction state between the node SD_IN and the node SD. The on/off of the transistors M11 and M13 is controlled by the signal BKH, and the on/off of the transistor M12 is controlled by the signal RCH.

The transistors M11 to M13 are OS transistors. The transistors M11 to M13 include back gates in the illustrated structure. The back gates of the transistors M11 to M13 are connected to a power supply line for supplying voltage VBG1.

At least the transistors M11 and M12 are preferably OS transistors. Because of extremely low off-state current, which is a feature of the OS transistor, a decrease in the voltage of the node SN11 can be inhibited and almost no power is consumed to retain data; therefore, the backup circuit 312 has a nonvolatile characteristic. Data is rewritten by charging and discharging of the capacitor C11; hence, there is theoretically no limitation on rewrite cycles of the backup circuit 312, and data can be written and read with low energy.

Figure 10B:
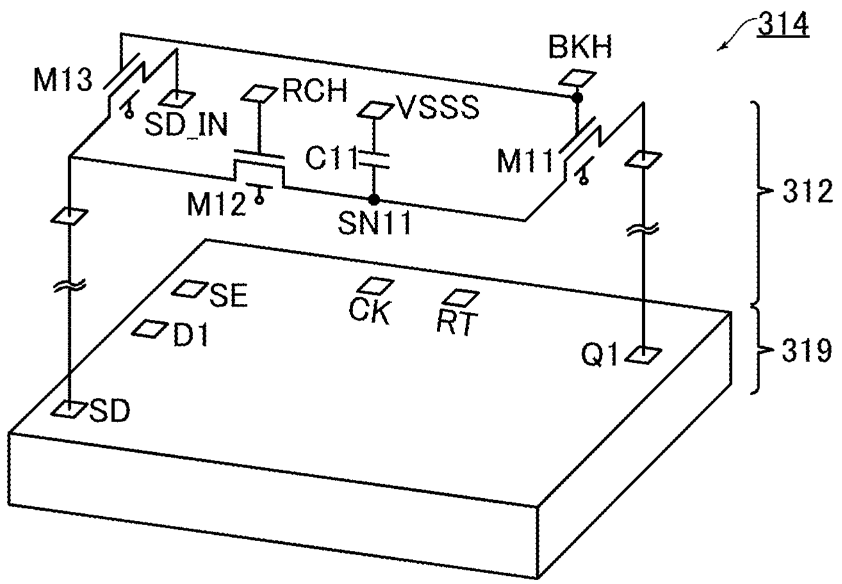

It is highly preferable that all of the transistors in the backup circuit 312 be OS transistors. As illustrated in FIG. 10B, the backup circuit 312 can be stacked on the scan flip-flop 319 formed using a silicon CMOS circuit.

In this specification and the like, a silicon CMOS circuit refers to a complementary circuit that includes a p-channel transistor and an n-channel transistor using a semiconductor material containing silicon. As the semiconductor material containing silicon, single crystal silicon, polycrystalline silicon, microcrystalline silicon, amorphous silicon, or the like can be used.

The number of elements in the backup circuit 312 is much smaller than the number of elements in the scan flip-flop 319; thus, there is no need to change the circuit structure and layout of the scan flip-flop 319 in order to stack the backup circuit 312. That is, the backup circuit 312 is a backup circuit that has great versatility. In addition, the backup circuit 312 can be provided in a region where the scan flip-flop 319 is formed; thus, even when the backup circuit 312 is incorporated, the area overhead of the flip-flop 314 can be made preferably zero. Thus, providing the backup circuit 312 in the flip-flop 314 enables power gating of the CPU core 301. The CPU core 301 can be power-gated with high efficiency owing to little energy required for the power gating.

When the backup circuit 312 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 319. That is, even when the backup circuit 312 is provided, the performance of the flip-flop 314 does not substantially decrease.

The CPU core 301 can be set to a clock gating state, a power gating state, or an idle state, for example, as a low-power consumption state. The PMU 303 selects the low-power consumption mode of the CPU core 301 on the basis of the interrupt signal, the signal SLEEP1, or the like. For example, in the case of transition from a normal operating state to the clock gating state, the PMU 303 stops generation of the clock signal GCLK1.

For example, in the case of transition from the normal operating state to the idle state, the PMU 303 performs voltage and/or frequency scaling. For example, in the case where the voltage scaling is performed, the PMU 303 turns off the power switch 305 and turns on the power switch 306 to input the voltage VDD1 to the CPU core 301. The voltage VDD1 is voltage at which data in the scan flip-flop 319 is not lost. In the case where the frequency scaling is performed, the PMU 303 decreases the frequency of the clock signal GCLK1.

In the case where the CPU core 301 transitions from the normal operating state to the power gating state, data in the scan flip-flop 319 is backed up to the backup circuit 312. When the CPU core 301 returns from the power gating state to the normal operating state, operation of restoring data in the backup circuit 312 to the scan flip-flop 319 is performed.

Figure 11A:
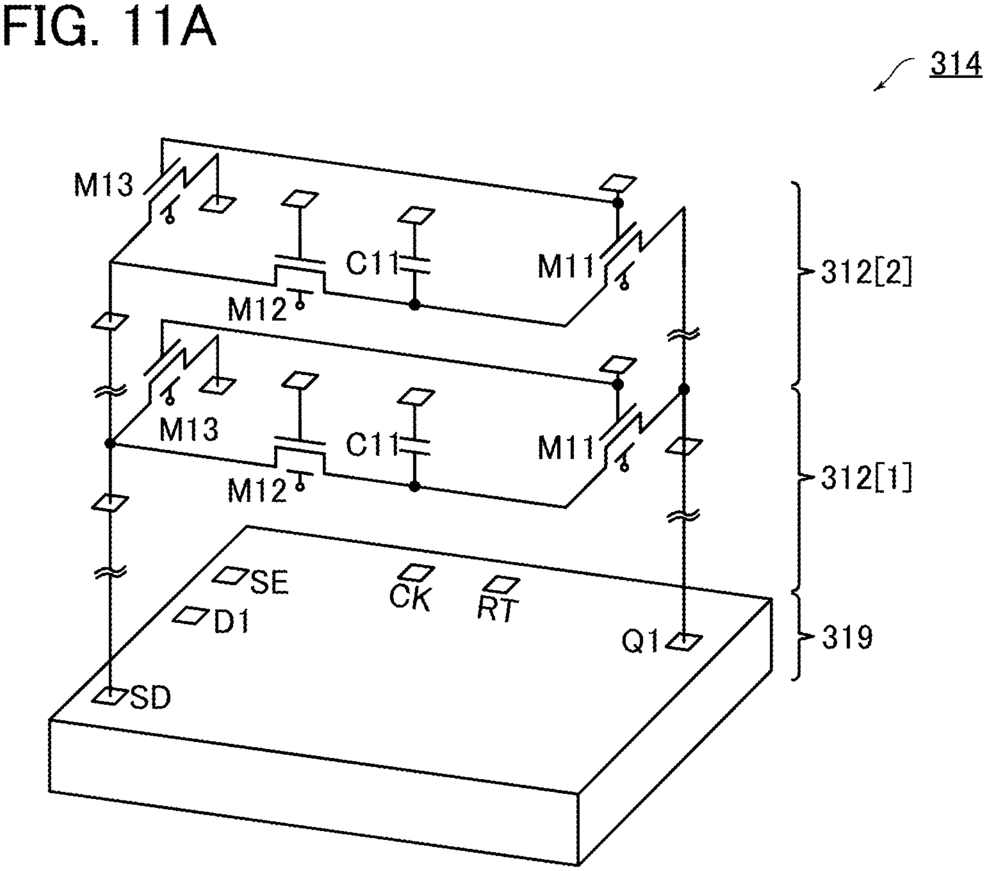
FIG. 11A and FIG. 11B are diagrams each illustrating a structure example of the CPU.

In addition, a plurality of backup circuits 312 (backup circuits 312[1] and 312[2] are illustrated in FIG. 11A) can be stacked in different layers over the scan flip-flop 319 formed using the silicon CMOS circuit like the flip-flop 314 illustrated in FIG. 11A. With this structure, the plurality of backup circuits 312 can be provided in a region where the scan flip-flop 319 is formed; thus, even when the plurality of backup circuits 312 are incorporated, the area overhead of the flip-flop 314 can be made preferably zero.

Figure 11B:
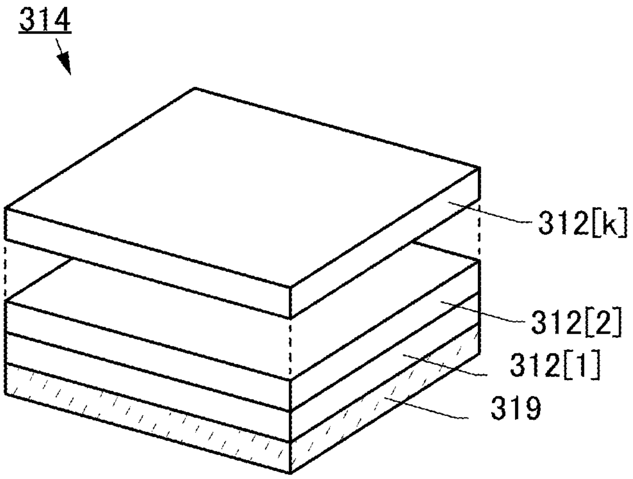

Note that in the flip-flop 314, as illustrated in FIG. 11B, the backup circuits 312 can be backup circuits 312[1] to 312[*k*] where k (k is an integer greater than or equal to 2) layers are stacked over the scan flip-flop 319.

Figure 12:
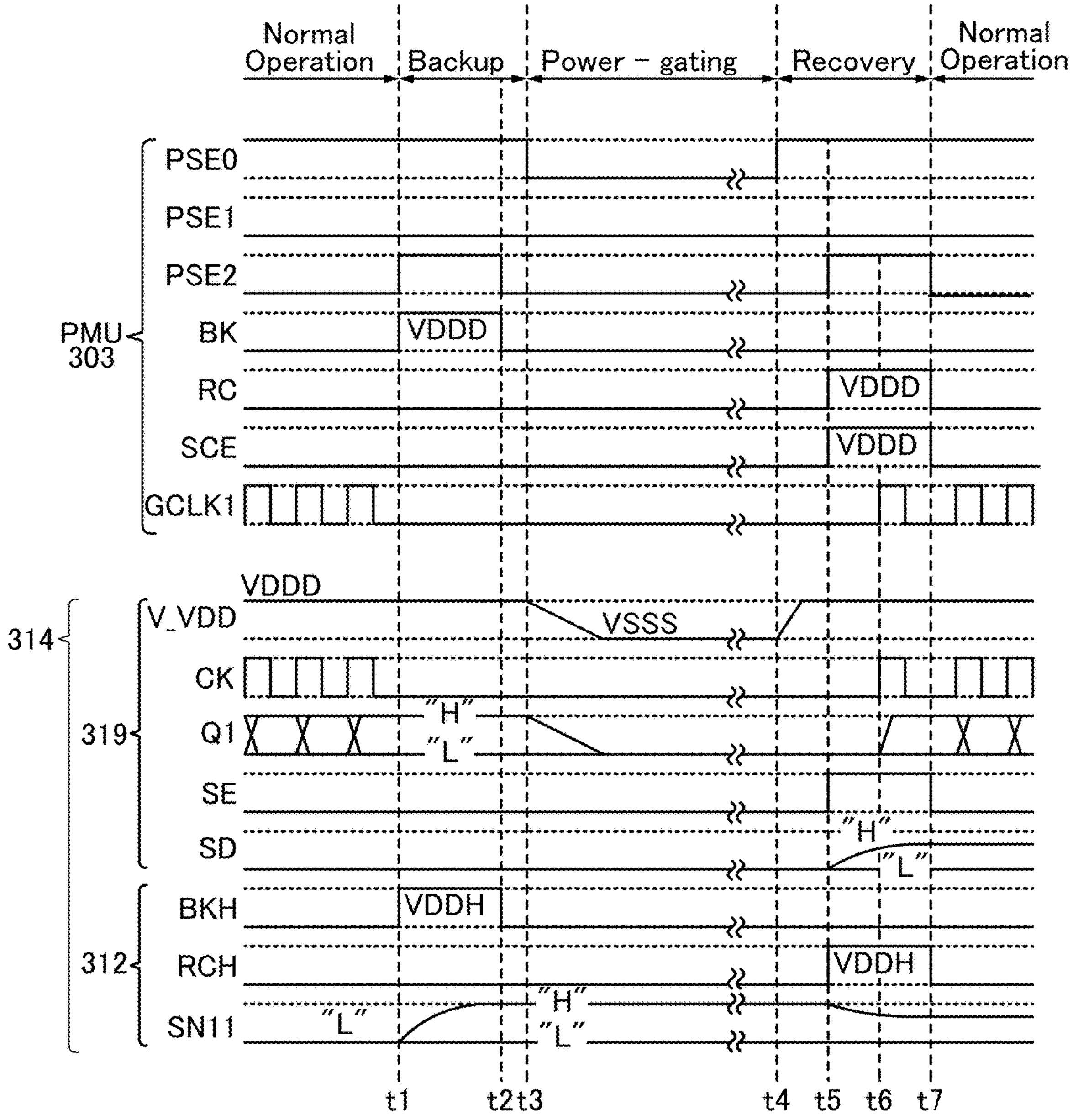
FIG. 12 is a diagram showing a structure example of the CPU.

FIG. 12 shows an example of the power gating sequence of the CPU core 301. Note that in FIG. 12, t1 to t7 represent time. Signals PSE0 to PSE2 are control signals of the power switches 305 to 307 and are generated in the PMU 303. When the signal PSE0 is at "H"/"L," the power switch 305 is on/off. The same applies to the signals PSE1 and PSE2.

Before Time t1, the CPU core 301 is in the normal operating state (Normal Operation). The power switch 305 is on, and the voltage VDDD is input to the CPU core 301. The scan flip-flop 319 performs normal operation. At this time, the level shifter 308 does not need to be operated; thus, the power switch 307 is off and the signals SCE, BK, and RC are at "L." The node SE is at "L," so that the scan flip-flop 319 stores data in the node D1. Note that in the example of FIG. 12, the node SN11 of the backup circuit 312 is at "L" at Time t1.

Backup operation is described. At Time t1 of operation, the PMU 303 stops the clock signal GCLK1 and sets the signals PSE2 and BK to "H." The level shifter 308 becomes active and outputs the signal BKH at "H" to the backup circuit 312.

The transistor M11 in the backup circuit 312 is turned on, and data in the node Q1 of the scan flip-flop 319 is written to the node SN11 of the backup circuit 312. When the node Q1 of the scan flip-flop 319 is at "L," the node SN11 remains at "L," whereas when the node Q1 is at "H," the node SN11 becomes "H."

The PMU 303 sets the signals PSE2 and BK to "L" at Time t2 and sets the signal PSE0 to "L at Time t3. The state of the CPU core 301 transitions to the power gating state at Time t3. Note that at the timing when the signal BK falls, the signal PSE0 may fall.

Power-gating operation is described. When the signal PSE0 is set to "L, the data in the node Q1 is lost because the voltage of the V_VDD line decreases. The node SN11 keeps retaining the data in the node Q1 at Time t3.

Recovery operation is described. When the PMU 303 sets the signal PSE0 to "H" at Time t4, the power gating state transitions to a recovery state. Charging of the V_VDD line starts, and the PMU 303 sets the signals PSE2, RC, and SCE to "H" in a state where the voltage of the V_VDD line becomes VDDD (at Time t5).

The transistor M12 is turned on, and electric charge in the capacitor C11 is distributed to the node SN11 and the node SD. When the node SN11 is at "H," the voltage of the node SD increases. The node SE is at "H," so that data in the node SD is written to a latch circuit on the input side of the scan flip-flop 319. When the clock signal GCLK1 is input to the node CK at Time t6, data in the latch circuit on the input side is written to the node Q1. That is, data in the node SN11 is written to the node Q1.

When the PMU 303 sets the signals PSE2, SCE, and RC to "L" at Time t7, the recovery operation is terminated.

The backup circuit 312 using OS transistors is extremely suitable for normally-off computing because both dynamic power consumption and static power consumption are low. Note that the CPU 310 that includes the CPU core 301 including the backup circuit 312 using OS transistors can be referred to as NoffCPU (registered trademark). The NoffCPU includes a nonvolatile memory, and power supply can be stopped during the time when operation is not needed. Even mounting the flip-flop 314 can hardly cause a decrease in performance of the CPU core 301 and an increase in dynamic power.

Note that the CPU core 301 may include a plurality of power domains capable of power gating. In the plurality of power domains, one or more power switches for controlling voltage input are provided. In addition, the CPU core 301 may include one or more power domains where power gating is not performed. For example, the power domain where power gating is not performed may be provided with a power gating control circuit for controlling the flip-flop 314 and the power switches 305 to 307.

Note that the application of the flip-flop 314 is not limited to the CPU 310. In the CPU 310, the flip-flop 314 can be applied to the register provided in the power domain capable of power gating.

The structure described above in this embodiment can be used in combination with the structures described in the other embodiments as appropriate.

Embodiment 3

In this embodiment, structures of transistors that can be used in the semiconductor device described in the above embodiment will be described. For example, a structure in which transistors having different electrical characteristics are stacked and provided will be described. With such a structure, the degree of freedom in design of a semiconductor device can be increased. In addition, providing transistors having different electrical characteristics to be stacked can increase the integration degree of the semiconductor device.

Figure 13:
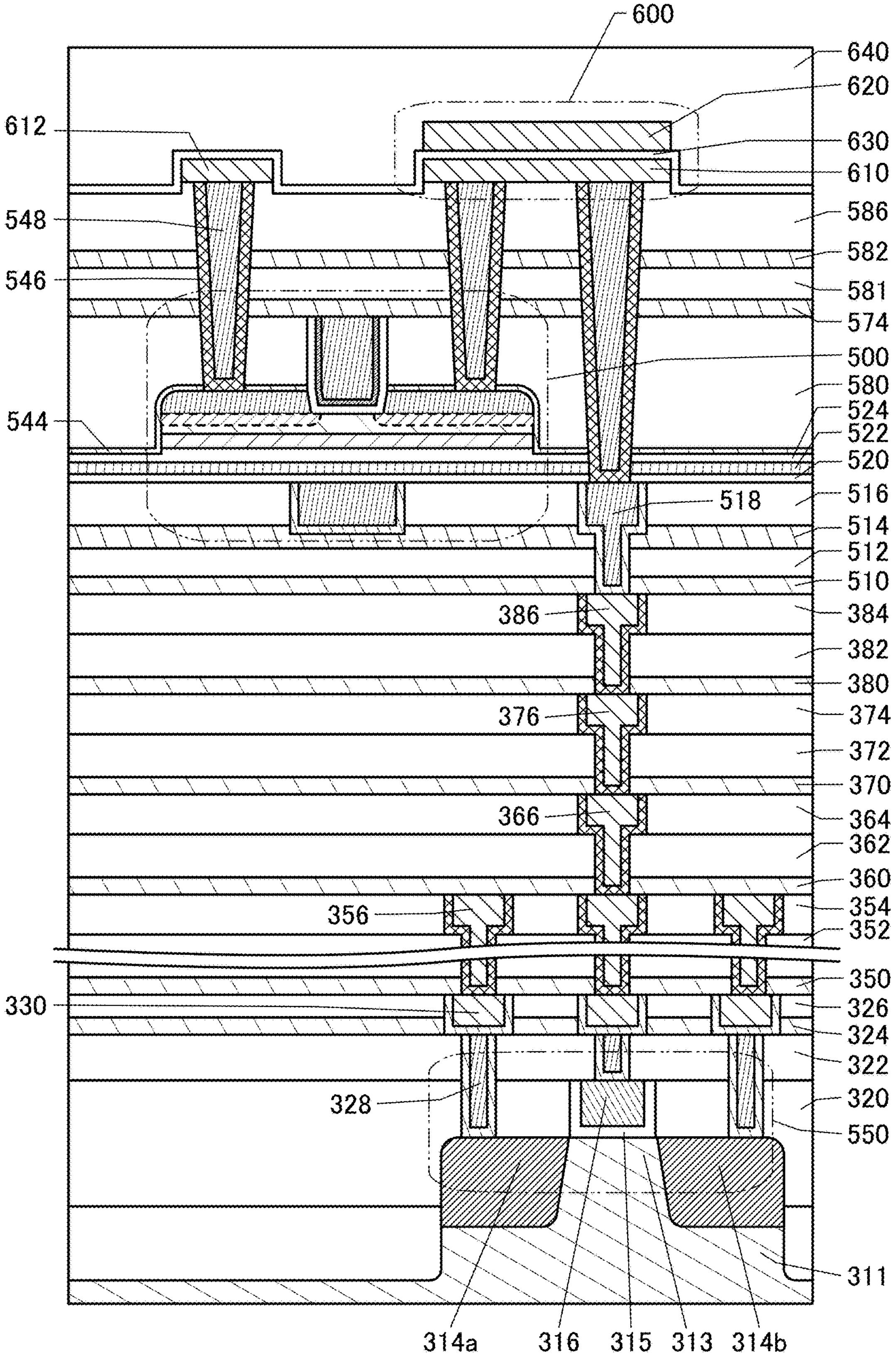
FIG. 13 is a diagram illustrating a structure example of a semiconductor device.
Figure 14A:
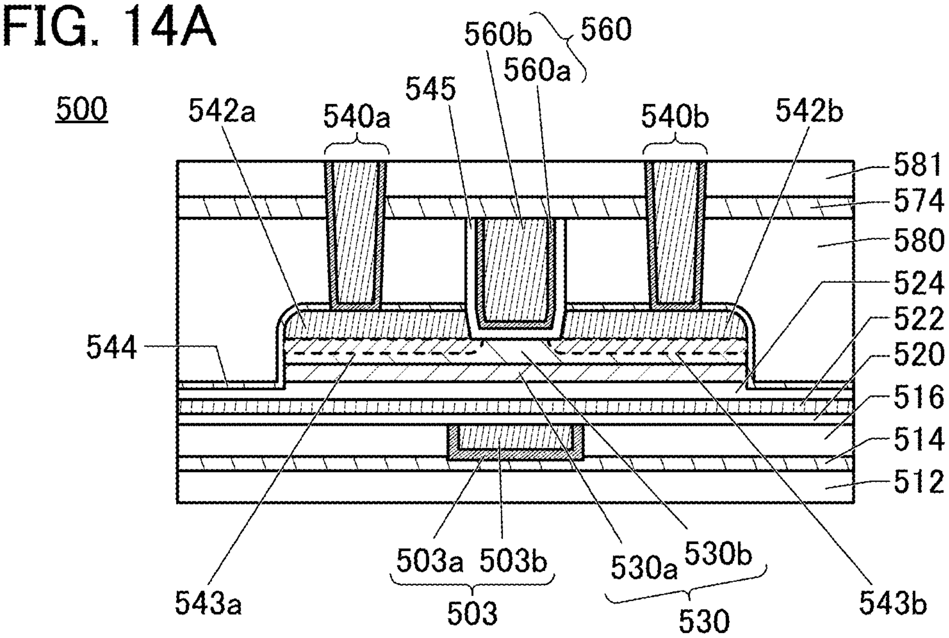
FIG. 14A to FIG. 14C are diagrams each illustrating a structure example of the semiconductor device.
Figure 14B:
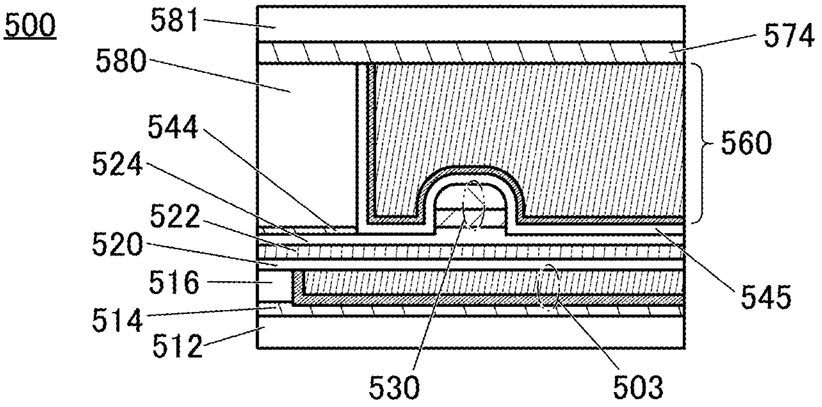
Figure 14C:
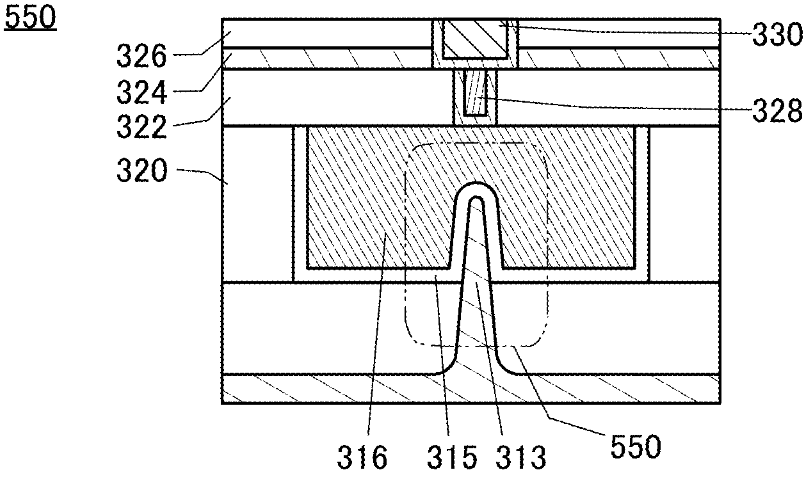

FIG. 13 illustrates part of a cross-sectional structure of a semiconductor device. The semiconductor device illustrated in FIG. 13 includes a transistor 550, a transistor 500, and a capacitor 600. FIG. 14A is a cross-sectional view of the transistor 500 in a channel length direction, FIG. 14B is a cross-sectional view of the transistor 500 in a channel width direction, and FIG. 14C is a cross-sectional view of the transistor 550 in a channel width direction. For example, the transistor 500 corresponds to a transistor including silicon in a channel formation region (a Si transistor), and the transistor 550 corresponds to an OS transistor.

In FIG. 13, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314*a* and a low-resistance region 314*b* each functioning as a source region or a drain region.

As illustrated in FIG. 14C, in the transistor 550, a top surface and a side surface in the channel width direction of the semiconductor region 313 are covered with the conductor 316 with the insulator 315 therebetween. The use of such a Fin-type transistor as the transistor 550 can increase the effective channel width and thus improve on-state characteristics of the transistor 550. In addition, contribution of the electric field of a gate electrode can be increased, so that the off-state characteristics of the transistor 550 can be improved.

Note that the transistor 550 may be either a p-channel transistor or an n-channel transistor.

A region of the semiconductor region 313 where a channel is formed, a region in the vicinity thereof, the low-resistance region 314*a* and the low-resistance region 314*b* each functioning as a source region or a drain region, and the like preferably contain a semiconductor material such as silicon, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to a crystal lattice and changing lattice spacing may be employed. Alternatively, the transistor 550 may be a HEMT (High Electron Mobility Transistor) using GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used.

Note that since a work function depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (silicon on Insulator) substrate or the like.

In addition, as the SOI substrate, the following substrate may be used: a SIMOX (Separation by Implanted Oxygen) substrate that is formed in such a manner that after an oxygen ion is implanted into a mirror-polished wafer, an oxide layer is formed at a certain depth from a surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by heat treatment; an ELTRAN method (a registered trademark: Epitaxial Layer Transfer); or the like. A transistor formed using a single crystal substrate contains a single crystal semiconductor in a channel formation region.

An insulator 320, an insulator 322, an insulator 324, and an insulator 326 are sequentially stacked and provided to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen, impurities, or the like from the substrate 311, the transistor 550, or the like into a region where the transistor 500 is provided.

For the film having a barrier property against hydrogen, for example, silicon nitride formed by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 550. The film that inhibits hydrogen diffusion is specifically a film from which a small amount of hydrogen is released.

The amount of released hydrogen can be measured by thermal desorption spectroscopy (TDS) or the like, for example. The amount of hydrogen released from the insulator 324 that is converted into hydrogen atoms per area of the insulator 324 is less than or equal to $1\times10^{16}$ atoms/cm$^2$, preferably less than or equal to $5\times10^{15}$ atoms/cm$^2$, in TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. In addition, the relative permittivity of the insulator 326 is, for example, preferably 0.7 times or less, further preferably 0.6 times or less the relative permittivity of the insulator 324. When a material with low permittivity is used for the interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 13, an insulator 350, an insulator 352, and an insulator 354 are sequentially stacked and provided. Furthermore, a conductor 356 is formed in the insulator 350, the insulator 352, and the insulator 354. The conductor 356 has a function of a plug connected to the transistor 550 or a wiring. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably includes a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated with a barrier layer, so that hydrogen diffusion from the transistor 550 into the transistor 500 can be inhibited.

Note that for the conductor having a barrier property against hydrogen, tantalum nitride or the like is preferably used, for example. In addition, by stacking tantalum nitride and tungsten, which has high conductivity, diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 13, an insulator 360, an insulator 362, and an insulator 364 are sequentially stacked and provided. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably includes a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated with a barrier layer, so that hydrogen diffusion from the transistor 550 into the transistor 500 can be inhibited.

A wiring layer may be provided over the insulator 364 and the conductor 366. For example, in FIG. 13, an insulator 370, an insulator 372, and an insulator 374 are sequentially stacked and provided. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably includes a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated with a barrier layer, so that hydrogen diffusion from the transistor 550 into the transistor 500 can be inhibited.

A wiring layer may be provided over the insulator 374 and the conductor 376. For example, in FIG. 13, an insulator 380, an insulator 382, and an insulator 384 are sequentially stacked and provided. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably includes a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated with a barrier layer, so that hydrogen diffusion from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device according to this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are sequentially stacked and provided over the insulator 384. A substance having a barrier property against oxygen, hydrogen, or the like is preferably used for any of the insulator 510, the insulator 512, the insulator 514, and the insulator 516.

For example, for each of the insulator 510 and the insulator 514, it is preferable to use a film having a barrier property that prevents diffusion of hydrogen, impurities, or the like from the substrate 311, a region where the transistor 550 is provided, or the like into a region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for each of the insulator 510 and the insulator 514, for example.

In particular, aluminum oxide has an excellent blocking effect that prevents passage of both oxygen and impurities such as hydrogen and moisture which are factors of fluctuation in electrical characteristics of the transistor. Accordingly, aluminum oxide can prevent mixing of impurities such as hydrogen and moisture into the transistor 500 during and after a manufacturing process of the transistor. In addition, release of oxygen from the oxide included in the transistor 500 can be inhibited. Therefore, aluminum oxide is suitably used for a protective film of the transistor 500.

In addition, for each of the insulator 512 and the insulator 516, a material similar to that for the insulator 320 can be used, for example. Furthermore, when a material with comparatively low permittivity is used for these insulators, parasitic capacitance generated between wirings can be reduced. A silicon oxide film, a silicon oxynitride film, or the like can be used for each of the insulator 512 and the insulator 516, for example.

Furthermore, a conductor 518, a conductor included in the transistor 500 (a conductor 503, for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated with a layer having a barrier property against oxygen, hydrogen, and water, so that hydrogen diffusion from the transistor 550 into the transistor 500 can be inhibited.

The transistor 500 is provided above the insulator 516.

As illustrated in FIG. 14A and FIG. 14B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap a region between the conductor 542*a* and the conductor 542*b*; an insulator 545 positioned on a bottom surface and a side surface of the opening; and a conductor 560 positioned on a formation surface of the insulator 545.

In addition, as illustrated in FIG. 14A and FIG. 14B, an insulator 544 is preferably positioned between the insulator 580 and the oxide 530*a*, the oxide 530*b*, the conductor 542*a*, and the conductor 542*b*. Furthermore, as illustrated in FIG. 14A and FIG. 14B, the conductor 560 preferably includes a conductor 560*a* provided inside the insulator 545 and a conductor 560*b* provided to be embedded inside the conductor 560*a*. Moreover, as illustrated in FIG. 14A and FIG. 14B, an insulator 574 is preferably positioned over the insulator 580, the conductor 560, and the insulator 545.

Note that in this specification and the like, the oxide 530*a* and the oxide 530*b* are sometimes collectively referred to as an oxide 530.

Note that the transistor 500 is illustrated to have a structure in which two layers, the oxide 530*a* and the oxide 530*b*, are stacked in the region where the channel is formed and its vicinity; however, the present invention is not limited thereto. For example, a structure may be employed in which a single layer of the oxide 530*b* or a stacked-layer structure of three or more layers is provided.

In addition, although the conductor 560 has a stacked-layer structure of two layers in the transistor 500, the present invention is not limited thereto. For example, the conductor 560 may have a single-layer structure or a stacked-layer structure of three or more layers. Furthermore, the transistor 500 illustrated in FIG. 13 and FIG. 14A is an example and the structure is not limited thereto; an appropriate transistor is used in accordance with a circuit structure, a driving method, or the like.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region sandwiched between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, which results in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping the conductor 542*a* or the conductor 542*b*. Thus, parasitic capacitance formed between the conductor 560 and each of the conductor 542*a* and the conductor 542*b* can be reduced. As a result, the switching speed of the transistor 500 can be increased, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, by changing a potential applied to the conductor 503 not in synchronization with but independently of a voltage applied to the conductor 560, the threshold voltage of the transistor 500 can be controlled. In particular, when a negative potential is applied to the conductor 503, the threshold voltage of the transistor 500 can be made higher than 0 V, and the off-state current can be reduced. Thus, drain current at the time when a potential applied to the conductor 560 is 0 V can be made lower in the case where a negative potential is applied to the conductor 503 than in the case where a negative potential is not applied to the conductor 503.

The conductor 503 is positioned to overlap the oxide 530 and the conductor 560. Thus, when a potential is applied to the conductor 560 and the conductor 503, an electric field generated from the conductor 560 and an electric field generated from the conductor 503 are connected, so that the channel formation region formed in the oxide 530 can be covered.

In this specification and the like, a transistor structure where a channel formation region is electrically surrounded by an electric field of a first gate electrode is referred to as a surrounded channel (S-channel) structure. In addition, the S-channel structure disclosed in this specification and the like has a structure different from a Fin-type structure and a planar structure. Meanwhile, the S-channel structure disclosed in this specification and the like can also be regarded as a kind of Fin-type structure. Note that in this specification and the like, the Fin-type structure refers to a structure where at least two or more surfaces (specifically, two surfaces, three surfaces, four surfaces, or the like) of a channel are covered with a gate electrode. With the Fin-type structure and the S-channel structure, resistance to a short-channel effect can be increased, that is, a transistor in which a short-channel effect is less likely to occur can be provided.

When the transistor has the S-channel structure, the channel formation region can be electrically surrounded. Note that since the S-channel structure is a structure where the channel formation region is electrically surrounded, it can also be said that the S-channel structure is a structure substantially equivalent to a GAA (Gate All Around) structure or an LGAA (Lateral Gate All Around) structure. When the transistor has the S-channel structure, the GAA structure, or the LGAA structure, a channel formation region that is formed at an interface between the oxide 530 and a gate insulator or in the vicinity of the interface can be the bulk of the oxide 530. Accordingly, the density of current flowing through the transistor can be improved, which can be expected to improve the on-state current of the transistor or increase the field-effect mobility of the transistor.

In addition, the conductor 503 has a structure similar to that of the conductor 518; a conductor 503*a* is formed in contact with an inner wall of an opening in the insulator 514 and the insulator 516, and a conductor 503*b* is formed on the inner side. Note that although the conductor 503*a* and the conductor 503*b* are stacked in the transistor 500, the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. Note that although the conductor 503 is illustrated to have a stacked layer of the conductor 503*a* and the conductor 503*b* in this embodiment, the conductor 503 may have a single-layer structure.

The insulator 520, the insulator 522, and the insulator 524 have a function of a second gate insulating film.

Here, an insulator containing oxygen more than that in the stoichiometric composition is preferably used as the insulator 524 in contact with the oxide 530. Such oxygen is easily released from the insulator by heating. In this specification and the like, oxygen released by heating is sometimes referred to as "excess oxygen." That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. Note that when hydrogen enters the oxygen vacancies in the oxide 530, such defects (hereinafter, referred to as $V_OH$ in some cases) serve as donors and generate electrons serving as carriers in some cases. In addition, in some cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by stress such as heat or an electric field; thus, the reliability of the transistor might be reduced when the oxide semiconductor contains a large amount of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (this treatment is also referred to as "dehydration" or "dehydrogenation treatment") and to compensate for oxygen vacancies by supplying oxygen to the oxide semiconductor (this treatment is also referred to as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, stable electrical characteristics can be given.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of higher than or equal to 100° C. and lower than or equal to 700° C., or higher than or equal to 100° C. and lower than or equal to 400° C.

In addition, any one or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when reaction in which a bond of $V_OH$ is cut occurs, i.e., reaction of "$V_OH \rightarrow V_O+H$" occurs. Part of hydrogen generated at this time is bonded to oxygen and is removed as $H_2O$ from the oxide 530 or an insulator in the vicinity of the oxide 530 in some cases. In other cases, part of hydrogen is gettered by a conductor 542.

In addition, for the microwave treatment, for example, it is suitable to use an apparatus including a power supply that generates high-density plasma or an apparatus including a power supply that applies RF to a substrate side. For example, high-density oxygen radicals can be generated with the use of an oxygen-containing gas and high-density plasma, and by applying RF to the substrate side, the oxygen radicals generated by the high-density plasma can be efficiently introduced into the oxide 530 or the insulator in the vicinity of the oxide 530. Furthermore, pressure in the microwave treatment is higher than or equal to 133 Pa, preferably higher than or equal to 200 Pa, further preferably higher than or equal to 400 Pa. Moreover, as a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In addition, in the manufacturing process of the transistor 500, it is suitable to perform the heat treatment with the surface of the oxide 530 exposed. The heat treatment is performed at higher than or equal to 100° C. and lower than or equal to 450° C., further preferably higher than or equal to 350° C. and lower than or equal to 400° C., for example. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then heat treatment is successively performed in a nitrogen gas or inert gas atmosphere.

Note that oxygen adding treatment performed on the oxide 530 can promote reaction in which oxygen vacancies in the oxide 530 are filled with supplied oxygen, i.e., reaction of "$V_O+O \rightarrow$null." Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen, impurities, or the like, oxygen contained in the oxide 530 is not diffused into the insulator 520 side, which is preferable. Furthermore, the conductor 503 can be inhibited from reacting with oxygen contained in the insulator 524, the oxide 530, or the like.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used for the insulator containing an oxide of one or both of aluminum and hafnium. In the case where the insulator 522 is formed using such a material, the insulator 522 functions as a layer that inhibits release of oxygen from the oxide 530 or mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and high relative permittivity.

Note that in the transistor 500 in FIG. 14A and FIG. 14B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is used as the oxide 530 including the channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

In addition, as the metal oxide functioning as the channel formation region in the oxide 530, a metal oxide whose band gap is greater than or equal to 2 eV, preferably greater than or equal to 2.5 eV is preferably used. The use of a metal oxide having such a wide band gap can reduce the off-state current of the transistor.

When the oxide 530 includes the oxide 530*a* under the oxide 530*b*, it is possible to inhibit diffusion of impurities into the oxide 530*b* from the components formed below the oxide 530*a*.

Note that the oxide 530 preferably has a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element Min the metal oxide used as the oxide 530*b* is preferably higher than the atomic ratio of In to the element M in the metal oxide used as the oxide 530*a*.

In addition, the energy of the conduction band minimum of the oxide 530*a* is preferably higher than the energy of the conduction band minimum of the oxide 530*b*. In other words, the electron affinity of the oxide 530*a* is preferably smaller than the electron affinity of the oxide 530*b*.

Here, the energy level of the conduction band minimum gradually changes at a junction portion of the oxide 530*a* and the oxide 530*b*. In other words, the energy level of the conduction band minimum at the junction portion of the oxide 530*a* and the oxide 530*b* continuously changes or is continuously connected. To change the energy level gradually, the density of defect states in a mixed layer formed at an interface between the oxide 530*a* and the oxide 530*b* is preferably made low.

Specifically, when the oxide 530*a* and the oxide 530*b* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used for the oxide 530*a*.

At this time, the oxide 530*b* serves as a main carrier path. When the oxide 530*a* has the above structure, the density of defect states at the interface between the oxide 530*a* and the oxide 530*b* can be made low. Thus, the influence of interface scattering on carrier conduction is small, and the transistor 500 can have high on-state current.

The conductor 542*a* and the conductor 542*b* functioning as the source electrode and the drain electrode are provided over the oxide 530*b*. For the conductor 542*a* and conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542*a* and the conductor 542*b* each having a single-layer structure are illustrated in FIG. 14A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 14A, a region 543*a* and a region 543*b* are sometimes formed as low-resistance regions at an interface between the oxide 530 and the conductor 542*a* (the conductor 542*b*) and in the vicinity of the interface. In that case, the region 543*a* functions as one of a source region and a drain region, and the region 543*b* functions as the other of the source region and the drain region. Furthermore, the channel formation region is formed in a region between the region 543*a* and the region 543*b*.

When the conductor 542*a* (the conductor 542*b*) is provided to be in contact with the oxide 530, the oxygen concentration in the region 543*a* (the region 543*b*) sometimes decreases. In addition, a metal compound layer that contains the metal contained in the conductor 542*a* (the conductor 542*b*) and the component of the oxide 530 is sometimes formed in the region 543*a* (the region 543*b*). In such a case, the carrier density of the region 543*a* (the region 543*b*) increases, and the region 543*a* (the region 543*b*) becomes a low-resistance region.

The insulator 544 is provided to cover the conductor 542*a* and the conductor 542*b* and inhibits oxidation of the conductor 542*a* and the conductor 542*b*. In this case, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542*a* and the conductor 542*b* are oxidation-resistant materials or materials that do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530*b* can be inhibited. Furthermore, oxidation of the conductor 542 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530*b*. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have high relative permittivity.

Although the conductor 560 that functions as the first gate electrode and has a two-layer structure is illustrated in FIG. 14A and FIG. 14B, a single-layer structure or a stacked-layer structure of three or more layers may be employed.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, it is possible to inhibit a reduction in conductivity of the conductor 560*b* due to oxidation caused by oxygen contained in the insulator 545. As a conductive material having a function of inhibiting diffusion of oxygen, for example, tantalum, tantalum nitride, ruthenium, ruthenium oxide, or the like is preferably used. Alternatively, for the conductor 560*a*, the oxide semiconductor that can be used as the oxide 530 can be used. In that case, when the conductor 560*b* is deposited by a sputtering method, the conductor 560*a* can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560*b*. Furthermore, the conductor 560*b* also functions as a wiring and thus a conductor having high conductivity is preferably used. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to those of a conductor 546 and a conductor 548 that will be described later.

An insulator 582 is provided over the insulator 581. A substance having a barrier property against oxygen, hydrogen, or the like is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of fluctuation in electrical characteristics of the transistor. Accordingly, aluminum oxide can prevent mixing of impurities such as hydrogen and moisture into the transistor 500 during and after the manufacturing process of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with comparatively low permittivity is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

In addition, after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. Note that when an opening is formed to surround the transistor 500, for example, formation of an opening reaching the insulator 522 or the insulator 514 and formation of the insulator having a high barrier property to be in contact with the insulator 522 or the insulator 514 are suitable because these formation steps can also serve as some of the manufacturing steps of the transistor 500. Note that the insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to employ a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed at the same time as another component such as a conductor, copper (Cu), aluminum (Al), or the like, which is a low-resistance metal material, may be used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

As a substrate that can be used for the semiconductor device according to one embodiment of the present invention, a glass substrate, a quartz substrate, a sapphire substrate, a ceramic substrate, a metal substrate (e.g., a stainless steel substrate, a substrate including stainless steel foil, a tungsten substrate, a substrate including tungsten foil, or the like), a semiconductor substrate (e.g., a single crystal semiconductor substrate, a polycrystalline semiconductor substrate, a compound semiconductor substrate, or the like), an SOI (silicon on Insulator) substrate, or the like can be used. Alternatively, a plastic substrate having heat resistance to processing temperature in this embodiment may be used. Examples of the glass substrate include barium borosilicate glass, aluminosilicate glass, aluminoborosilicate glass, and soda lime glass. Alternatively, crystallized glass or the like can be used.

Alternatively, a flexible substrate; an attachment film; paper or a base film including a fibrous material; or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, an aramid resin, an epoxy resin, an inorganic evaporated film, and paper. In particular, the use of a semiconductor substrate, a single crystal substrate, an SOI substrate, or the like for the manufacture of transistors enables the manufacture of small-sized transistors with a small variation in characteristics, size, shape, or the like and high current capability. When a circuit is formed with such transistors, lower power consumption of the circuit or higher integration of the circuit can be achieved.

Alternatively, a flexible substrate may be used as the substrate, and a transistor, a resistor, a capacitor, and/or the like may be formed directly on the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. Note that as the separation layer, a stacked-layer structure of a tungsten film and a silicon oxide film that are inorganic films, a structure in which an organic resin film of polyimide or the like is formed over a substrate, a silicon film containing hydrogen, or the like can be used, for example.

That is, a semiconductor device may be formed over one substrate and then transferred to another substrate. Examples of a substrate to which a semiconductor device is transferred include, in addition to the above substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of these substrates, the manufacture of a flexible semiconductor device, the manufacture of a robust semiconductor device, provision of high heat resistance, a reduction in weight, or a reduction in thickness can be achieved.

Providing a semiconductor device over a flexible substrate can inhibit an increase in weight and can provide a robust semiconductor device.

Note that the transistor 550 illustrated in FIG. 13 is an example and the structure is not limited thereto; an appropriate transistor is used in accordance with a circuit structure, a driving method, or the like. For example, when the semiconductor device is a circuit having single polarity that is composed of only OS transistors, which means the same-polarity transistors such as n-channel transistors only, for example, the transistor 550 has a structure similar to that of the transistor 500.

The configuration, structure, method, and the like described in this embodiment can be used in combination as appropriate with the configurations, structures, methods, and the like described in the other embodiments, an example, and the like.

Embodiment 4

In this embodiment, cross-sectional structure examples of storage devices including the OS transistors described in the above embodiments, such as a DOSRAM and a NOSRAM, are described.

"NOSRAM (registered trademark)" is an abbreviation for "Nonvolatile Oxide Semiconductor Random Access Memory (RAM)." When electric charge corresponding to data is retained using characteristics of extremely low leakage current, the NOSRAM can be used as a nonvolatile memory.

A DOSRAM (registered trademark) is an abbreviation of "Dynamic Oxide Semiconductor RAM," which indicates a RAM including a 1T (transistor) 1C (capacitor)-type memory cell. The DOSRAM, as well as the NOSRAM, is a memory utilizing the low off-state current of an OS transistor.

Figure 15:
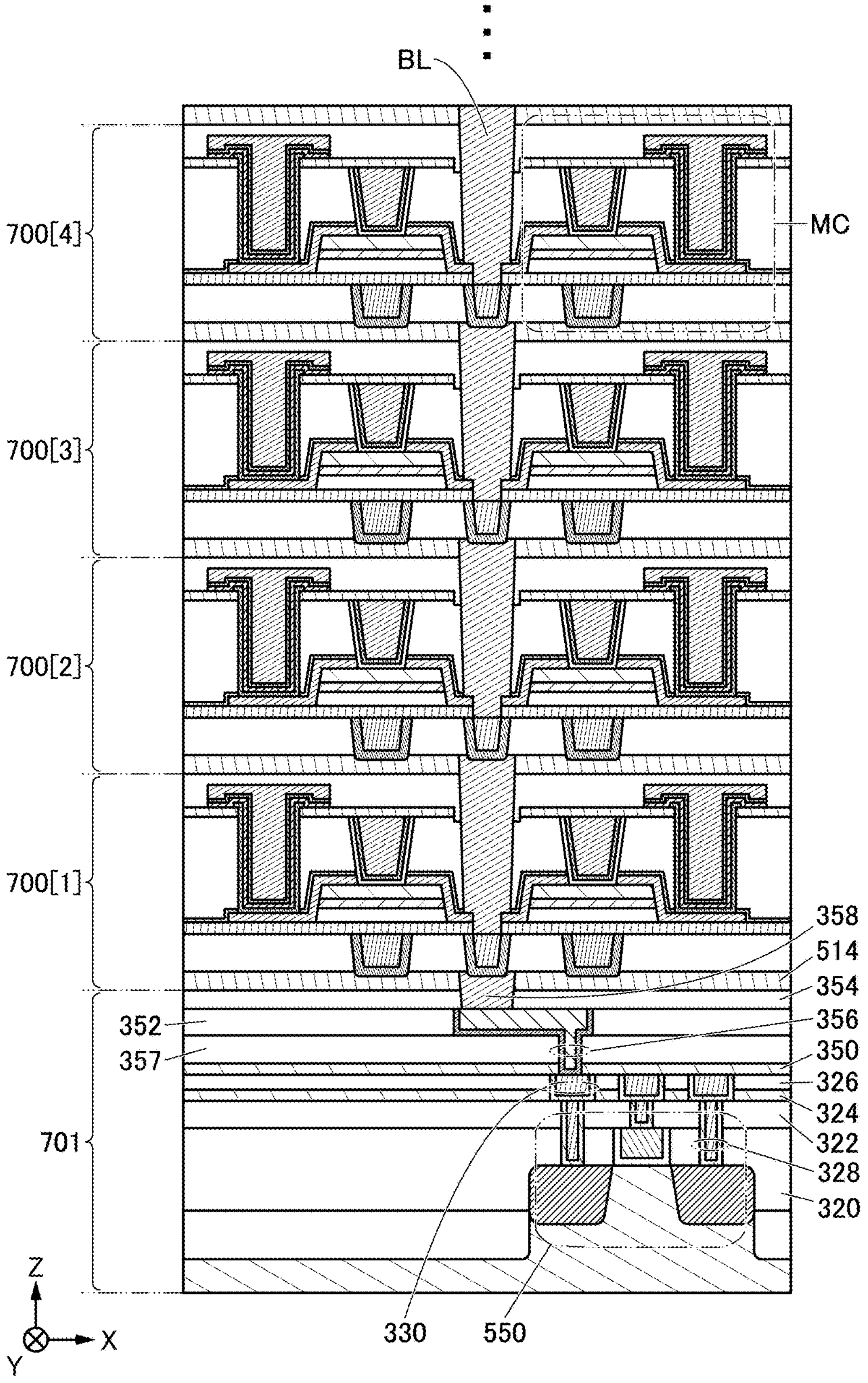
FIG. 15 is a diagram illustrating a structure example of a memory portion.

FIG. 15 illustrates a cross-sectional structure example of the case of using a DOSRAM circuit structure. In the example illustrated in FIG. 15, a memory layer 700[1] to a memory layer 700[4] are stacked over a driver circuit layer 701.

FIG. 15 also illustrates an example of the transistor 550 included in the driver circuit layer 701. As the transistor 550, the transistor 550 described in the above embodiment can be used.

Note that the transistor 550 illustrated in FIG. 15 is an example and is not limited to the structure illustrated therein; an appropriate transistor can be used in accordance with a circuit structure or a driving method.

A wiring layer provided with an interlayer film, a wiring, a plug, and the like may be provided between the driver circuit layer 701 and the memory layers 700 or between a k-th memory layer 700 and a (k+1)-th memory layer 700. Note that in this embodiment and the like, the k-th memory layer 700 is referred to as a memory layer 700[$k$], and the (k+1)-th memory layer 700 is referred to as a memory layer 700[$k$+1], in some cases. Here, k is an integer greater than or equal to 1 and less than or equal to N. In addition, in this embodiment and the like, the solutions of "k+α (α is an integer greater than or equal to 1)" and "k−α" are each an integer greater than or equal to 1 and less than or equal to N.

In addition, a plurality of wiring layers can be provided in accordance with design. Furthermore, in this specification and the like, a wiring and a plug electrically connected to the wiring may be a single component. That is, part of a conductor functions as a wiring in some cases, and part of a conductor functions as a plug in other cases.

For example, the insulator 320, the insulator 322, the insulator 324, and the insulator 326 are sequentially stacked and provided over the transistor 550 as interlayer films. In addition, the conductor 328 or the like is embedded in the insulator 320 and the insulator 322. Furthermore, the conductor 330 or the like is embedded in the insulator 324 and the insulator 326. Note that the conductor 328 and the conductor 330 each function as a contact plug or a wiring.

In addition, the insulators functioning as interlayer films may also function as planarization films that cover uneven shapes therebelow. For example, a top surface of the insulator 320 may be planarized by planarization treatment using a chemical mechanical polishing (CMP) method to increase planarity.

A wiring layer may be provided over the insulator 326 and the conductor 330. For example, in FIG. 15, the insulator 350, an insulator 357, the insulator 352, and the insulator 354 are sequentially stacked and provided over the insulator 326 and the conductor 330.

Furthermore, the conductor 356 is formed in the insulator 350, the insulator 357, and the insulator 352. The conductor 356 functions as a contact plug or a wiring.

The insulator 514 included in the memory layer 700[1] is provided over the insulator 354. In addition, a conductor 358 is embedded in the insulator 514 and the insulator 354. The conductor 358 functions as a contact plug or a wiring. For example, a wiring BL and the transistor 550 are electrically connected to each other through the conductor 358, the conductor 356, the conductor 330, and the like.

Figure 16A:
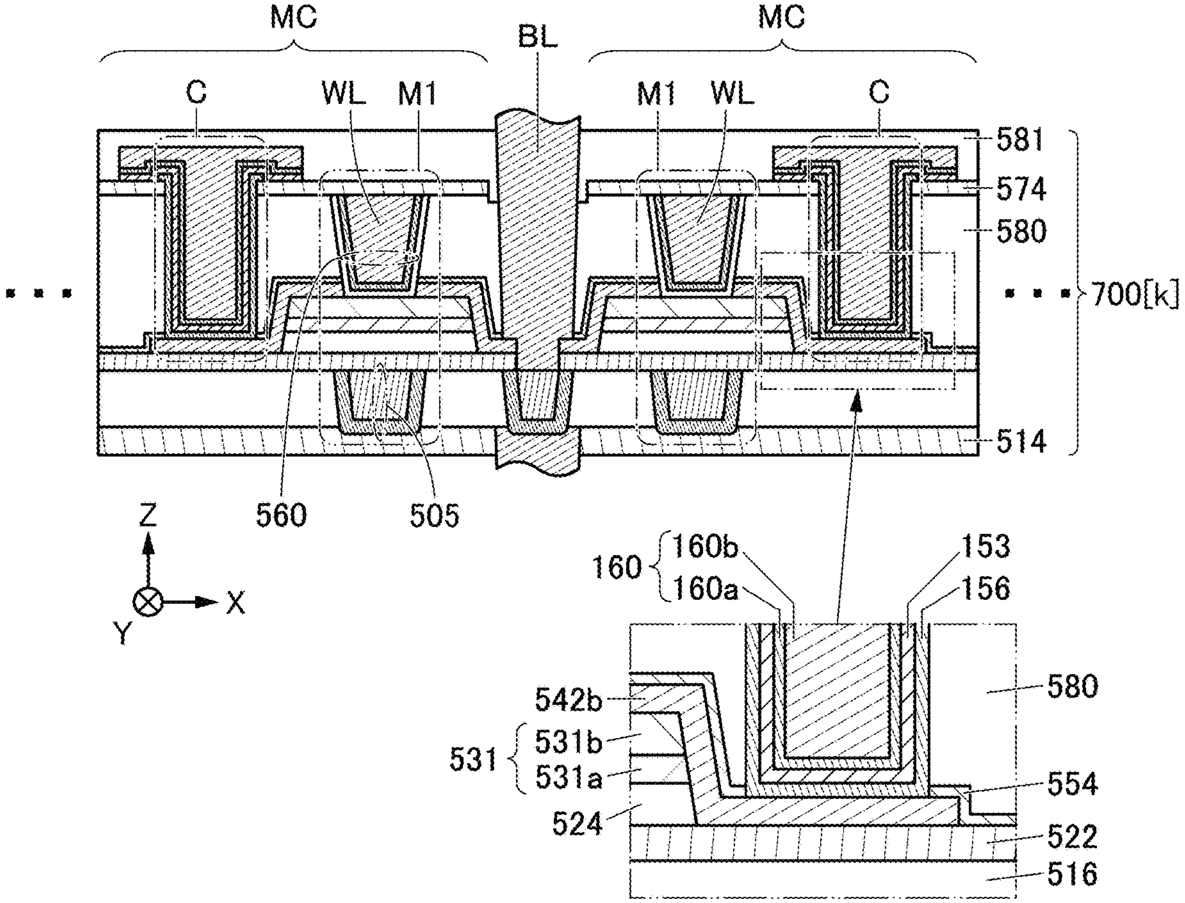
FIG. 16A is a diagram illustrating a structure example of a memory layer.
Figure 16B:
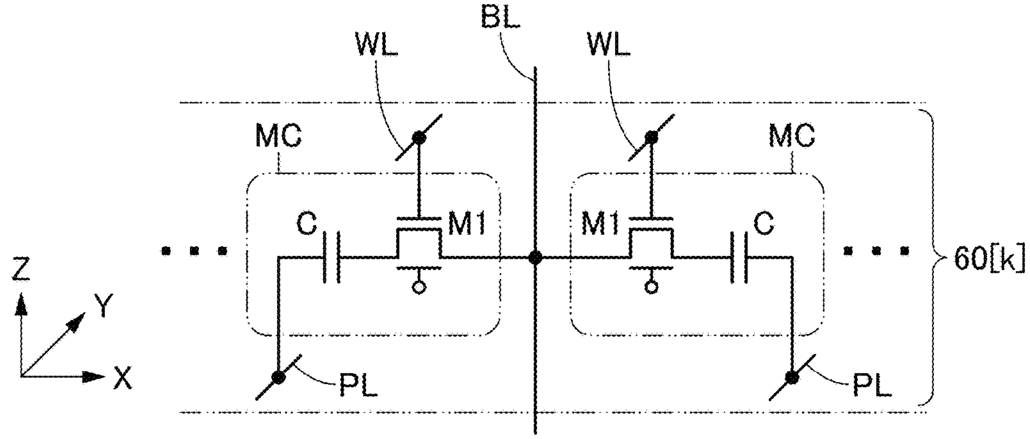
FIG. 16B is a diagram illustrating an equivalent circuit of the memory layer.

FIG. 16A illustrates a cross-sectional structure example of the memory layer 700[*k*]. In addition, FIG. 16B illustrates an equivalent circuit diagram of FIG. 16A. FIG. 16A illustrates an example where two memory cells MC are electrically connected to one wiring BL.

The memory cells MC illustrated in FIG. 15 and FIG. 16A each include the transistor M1 and a capacitor C. For example, the transistor 500 illustrated in the above embodiment can be used as the transistor M1.

Note that in this embodiment, a modification example of the transistor 500 is illustrated as the transistor M1. Specifically, the transistor M1 differs from the transistor 500 in that the conductor 542*a* and the conductor 542*b* extend beyond an edge of a metal oxide 531.

In addition, the memory cells MC illustrated in FIG. 15 and FIG. 16A each include a conductor 156 that functions as one terminal of the capacitor C, an insulator 153 that functions as a dielectric, and a conductor 160 (a conductor 160*a* and a conductor 160*b*) that functions as the other terminal of the capacitor C. The conductor 156 is electrically connected to part of the conductor 542*b*. Furthermore, the conductor 160 is electrically connected to a wiring PL (not illustrated in FIG. 16A).

The capacitor C is formed in an opening portion that is provided by removal of part of the insulator 574, the insulator 580, and an insulator 554. Since the conductor 156, the insulator 580, and the insulator 554 are formed along a side surface of the opening portion, the conductor 156, the insulator 580, and the insulator 554 are preferably deposited by an ALD method, a CVD method, or the like.

In addition, a conductor that can be used as a conductor 505 or the conductor 560 is used for each of the conductor 156 and the conductor 160. For example, titanium nitride formed by an ALD method is used for the conductor 156. Furthermore, titanium nitride formed by an ALD method is used for the conductor 160*a*, and tungsten formed by a CVD method is used for the conductor 160*b*. Note that in the case where the adhesion of tungsten to the insulator 153 is sufficiently high, a single-layer film of tungsten formed by a CVD method may be used for the conductor 160.

An insulator of a high permittivity (high-k) material (a material with high relative permittivity) is preferably used for the insulator 153. As the insulator of a high permittivity material, an oxide, an oxynitride, a nitride oxide, or a nitride containing one or more kinds of metal element selected from aluminum, hafnium, zirconium, gallium, and the like can be used, for example. In addition, the oxide, the oxynitride, the nitride oxide, or the nitride may contain silicon. Furthermore, insulating layers each formed of the above material can be stacked to be used.

As the insulator of a high permittivity material, aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, an oxynitride containing hafnium and zirconium, or the like can be used, for example. Using such a high permittivity material allows the insulator 153 to be thick enough to inhibit leakage current and can ensure sufficient capacitance of the capacitor C.

In addition, it is preferable to use stacked insulating layers each formed of the above materials. A stacked structure using a high permittivity material and a material having higher dielectric strength than the high permittivity material is preferably used. An insulating film in which zirconium oxide, aluminum oxide, and zirconium oxide are stacked in this order can be used for the insulator 153, for example. Alternatively, an insulating film in which zirconium oxide, aluminum oxide, zirconium oxide, and aluminum oxide are stacked in this order can be used, for example. Alternatively, an insulating film in which hafnium zirconium oxide, aluminum oxide, hafnium zirconium oxide, and aluminum oxide are stacked in this order can be used. The use of stacked insulators with comparatively high dielectric strength, such as aluminum oxide, can improve the dielectric strength and can inhibit electrostatic breakdown of the capacitor C.

Figure 17:
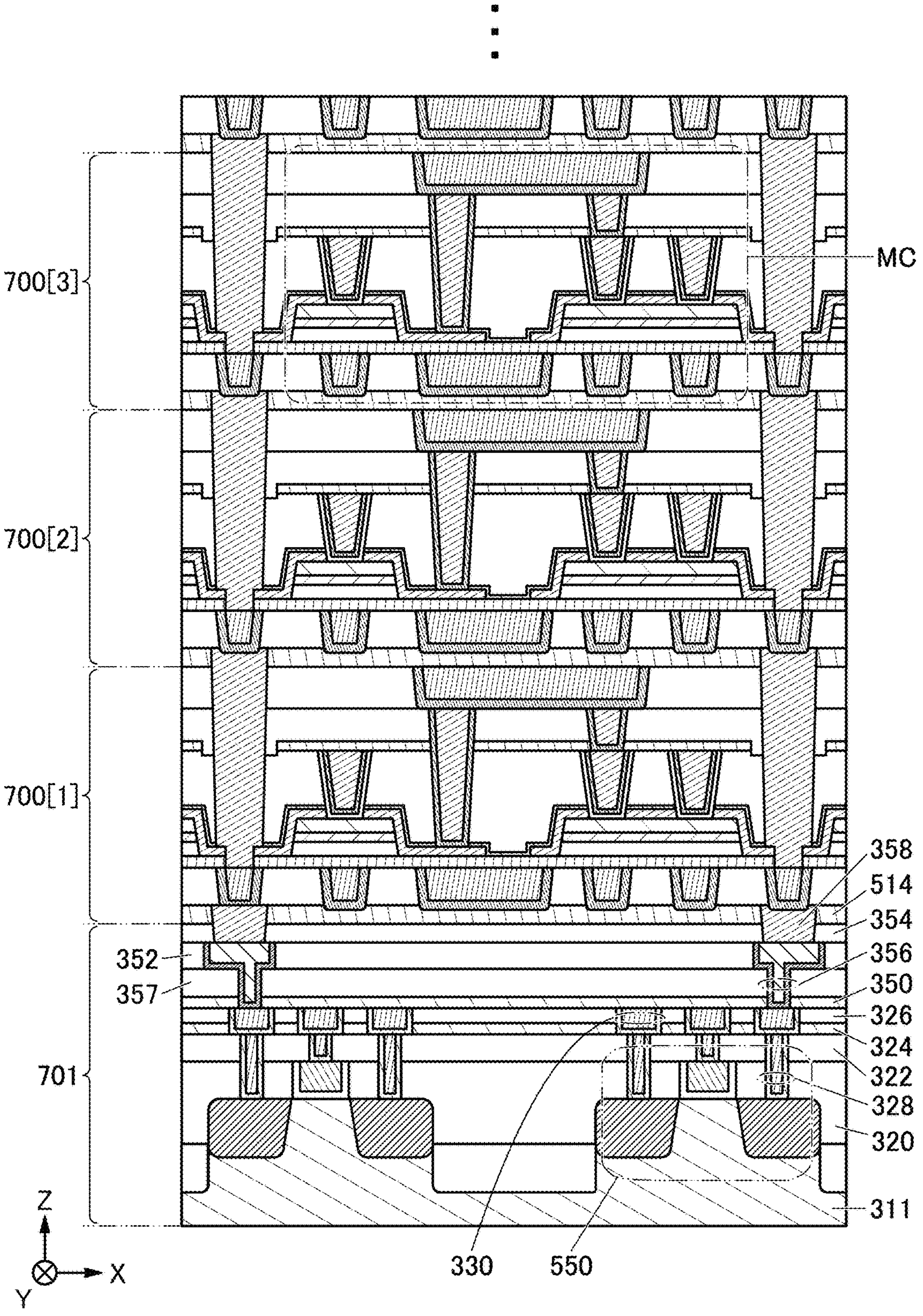
FIG. 17 is a diagram illustrating a structure example of the memory portion.
Figure 18A:
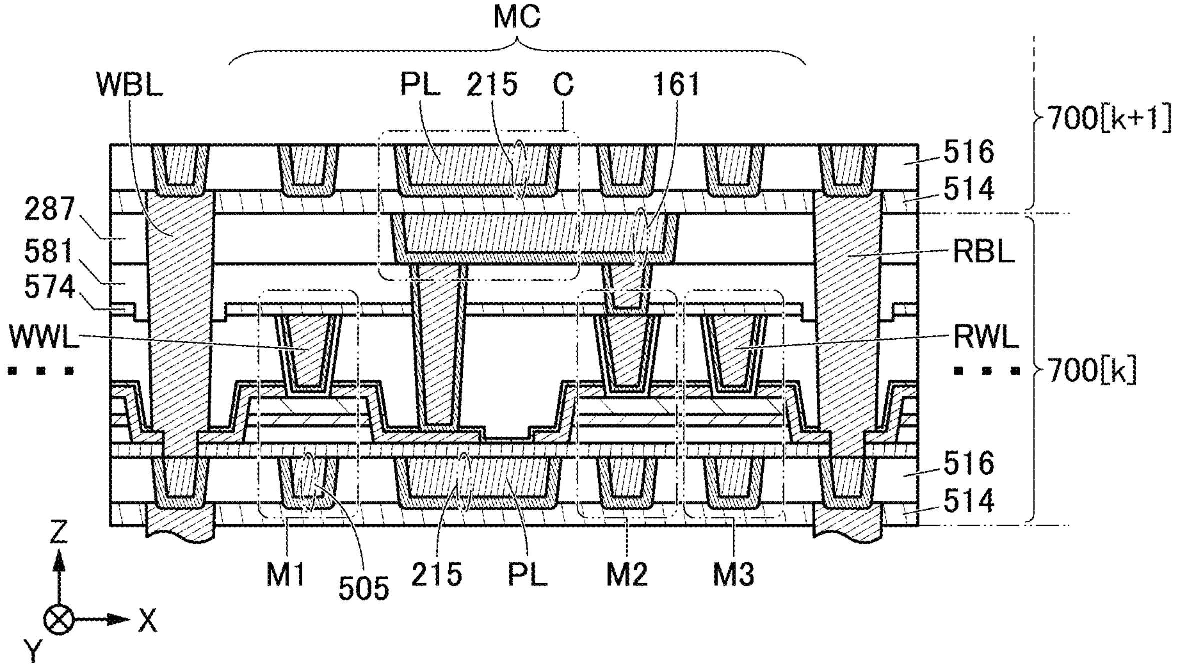
FIG. 18A is a diagram illustrating a structure example of memory layers.
Figure 18B:
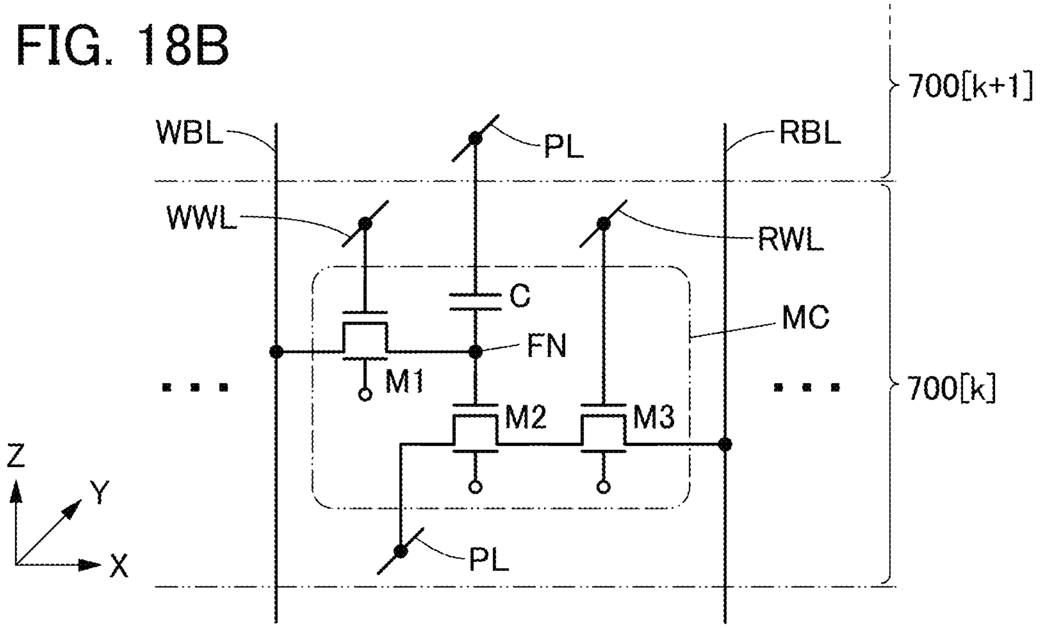
FIG. 18B is a diagram illustrating an equivalent circuit of the memory layers.

FIG. 17 illustrates a cross-sectional structure example of the case of using a NOSRAM memory cell circuit structure. Note that FIG. 17 is also a modification example of FIG. 15. In addition, FIG. 18A illustrates a cross-sectional structure example of the memory layer 700[*k*]. Furthermore, FIG. 18B illustrates an equivalent circuit diagram of FIG. 18A.

The memory cells MC illustrated in FIG. 17 and FIG. 18A each include the transistor M1, a transistor M2, and a transistor M3 over the insulator 514. In addition, a conductor 215 is provided over the insulator 514. The conductor 215 can be formed using the same material in the same process as those of the conductor 505 at the same time.

In addition, the transistor M2 and the transistor M3 illustrated in FIG. 17 and FIG. 18A share one island-shaped metal oxide 531. In other words, part of the one island-shaped metal oxide 531 functions as a channel formation region of the transistor M2, and another part thereof functions as a channel formation region of the transistor M3. Furthermore, a source of the transistor M2 and a drain of the transistor M3 are shared, or a drain of the transistor M2 and a source of the transistor M3 are shared. Thus, the area occupied by the transistor M2 and the transistor M3 is smaller than that of the case where the transistor M2 and the transistor M3 are independently provided.

In addition, in each of the memory cells MC illustrated in FIG. 17 and FIG. 18A, an insulator 287 is provided over the insulator 581, and a conductor 161 is embedded in the insulator 287. Furthermore, the insulator 514 of the memory layer 700[*k*+1] is provided over the insulator 287 and the conductor 161.

In FIG. 17 and FIG. 18A, the conductor 215 of the memory layer 700[*k*+1] functions as one terminal of the capacitor C, the insulator 514 of the memory layer 700[*k*+1] functions as a dielectric of the capacitor C, and the conductor 161 functions as the other terminal of the capacitor C. Furthermore, the other of a source and a drain of the transistor M1 is electrically connected to the conductor 161 through a contact plug, and a gate of the transistor M2 is electrically connected to the conductor 161 through another contact plug.

This embodiment can be implemented in combination with the other embodiments described in this specification as appropriate.

Embodiment 5

In this embodiment, an example of a chip including the semiconductor device according to one embodiment of the present invention and an example of a module in an electronic device are described.

Figure 19A:
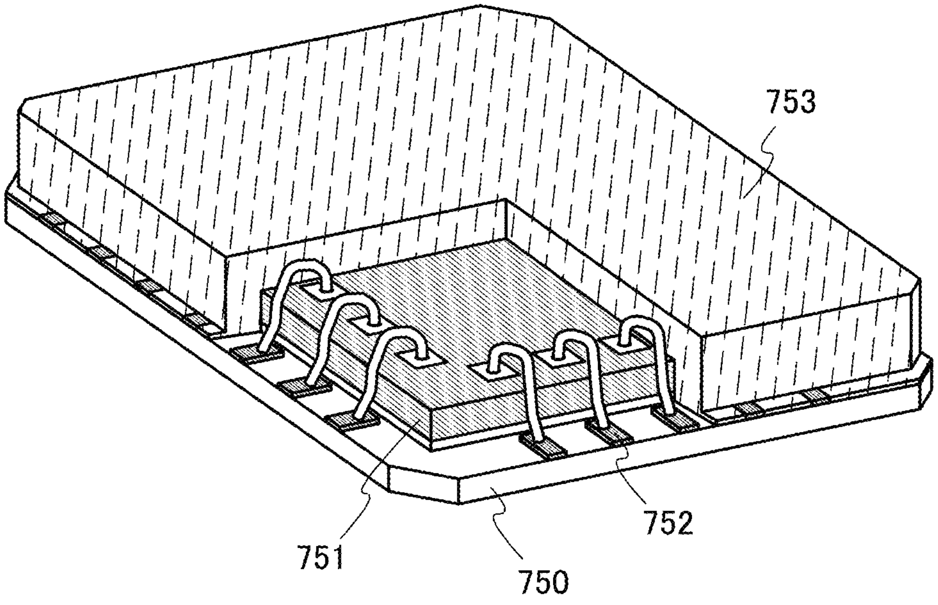
FIG. 19A and FIG. 19B are diagrams each illustrating a structure example of a semiconductor device.

FIG. 19A is a perspective view illustrating a cross-sectional structure of a package using a lead frame interposer.

In the package illustrated in FIG. 19A, a chip 751 corresponding to the semiconductor device according to one embodiment of the present invention is connected to a terminal 752 over an interposer 750 by wire bonding. The terminal 752 is placed on a surface of the interposer 750 on which the chip 751 is mounted. The chip 751 may be sealed by a mold resin 753, in which case the chip 751 is sealed such that part of each of terminals 752 is exposed.

Figure 19B:
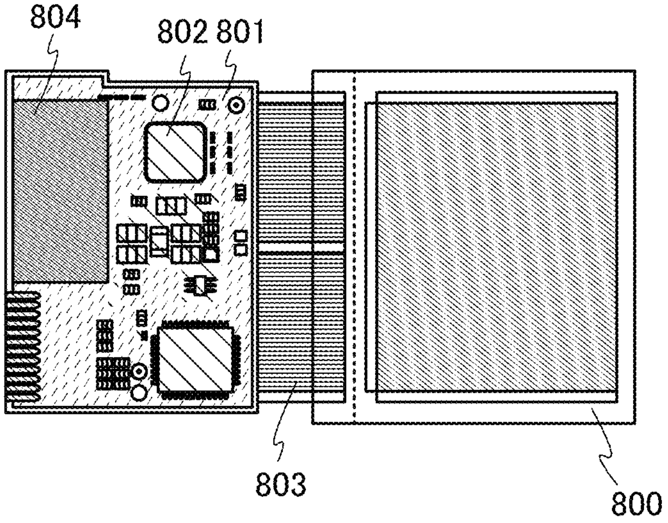

FIG. 19B illustrates the structure of a module in an electronic device in which a package is mounted on a circuit board.

In the module of a cellular phone illustrated in FIG. 19B, a package 802 and a battery 804 are mounted on a printed wiring board 801. In addition, the printed wiring board 801 is mounted on a panel 800 provided with a display element by an FPC 803.

The structure described above in this embodiment can be used in combination with the structures described in the other embodiments as appropriate.

Embodiment 6

A semiconductor device according to one embodiment of the present invention can be used for display devices, personal computers, or image reproducing devices provided with recording media (typically, devices that reproduce the content of recording media such as digital versatile discs (DVD) and have displays for displaying reproduced images). Other than the above, as electronic devices that can use the semiconductor device according to one embodiment of the present invention, cellular phones, game machines including portable game machines, portable information terminals, e-book readers, cameras such as video cameras and digital still cameras, goggles-type displays (head mounted displays), navigation systems, audio reproducing devices (car audio players, digital audio players, and the like), copiers, facsimiles, printers, multifunction printers, automated teller machines (ATM), vending machines, and the like can be given. FIG. 20 illustrates specific examples of these electronic devices.

Figure 20A:
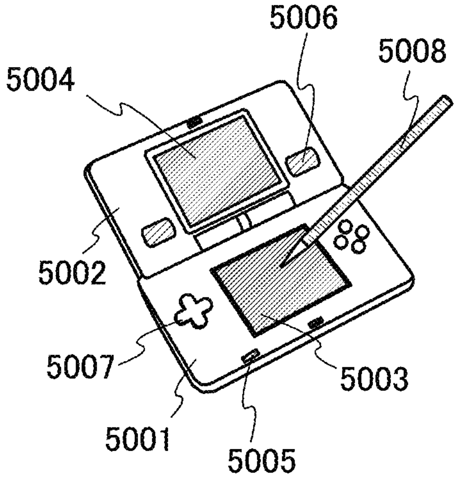
FIG. 20A to FIG. 20F are diagrams each illustrating a structure example of an electronic device.

FIG. 20A is a portable game machine, which includes a housing 5001, a housing 5002, a display portion 5003, a display portion 5004, a microphone 5005, a speaker 5006, an operation key 5007, a stylus 5008, and the like. The semiconductor device according to one embodiment of the present invention can be used for a variety of integrated circuits included in the portable game machine. Note that although the portable game machine illustrated in FIG. 20A has the two display portions 5003 and 5004, the number of display portions included in the portable game machine is not limited thereto.

Figure 20B:
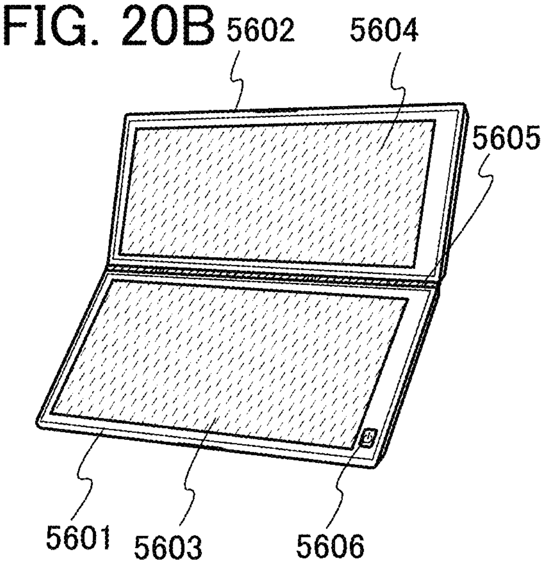

FIG. 20B is a portable information terminal, which includes a first housing 5601, a second housing 5602, a first display portion 5603, a second display portion 5604, a connection portion 5605, an operation key 5606, and the like. The first display portion 5603 is provided in the first housing 5601, and the second display portion 5604 is provided in the second housing 5602. Furthermore, the first housing 5601 and the second housing 5602 are connected to each other with the connection portion 5605, and an angle between the first housing 5601 and the second housing 5602 can be changed with the connection portion 5605. Images on the first display portion 5603 may be switched in accordance with the angle at the connection portion 5605 between the first housing 5601 and the second housing 5602. The semiconductor device according to one embodiment of the present invention can be used for a variety of integrated circuits included in the portable information terminal. Moreover, a display device with a function of a position input device may be used as at least one of the first display portion 5603 and the second display portion 5604. Note that the function of the position input device can be added through providing a touch panel in a display device. Alternatively, the function of the position input device can be added through providing a photoelectric conversion element called a photosensor in a pixel portion of a display device.

Figure 20C:
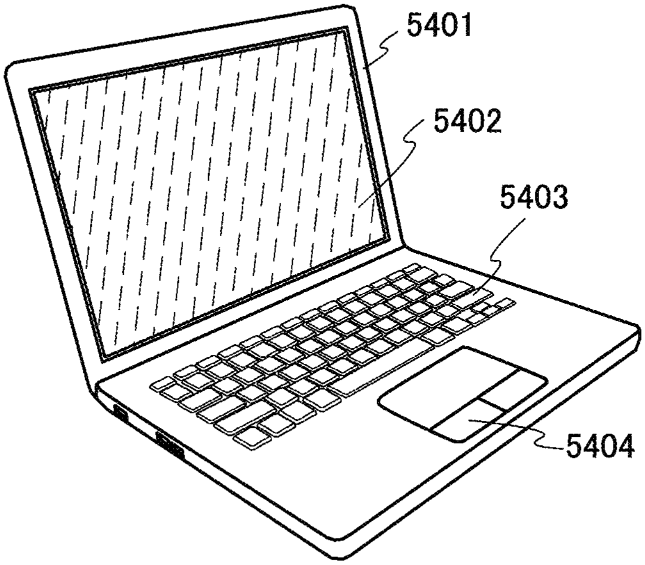

FIG. 20C is a laptop personal computer, which includes a housing 5401, a display portion 5402, a keyboard 5403, a pointing device 5404, and the like. The semiconductor device according to one embodiment of the present invention can be used for a variety of integrated circuits included in the laptop personal computer.

Figure 20D:
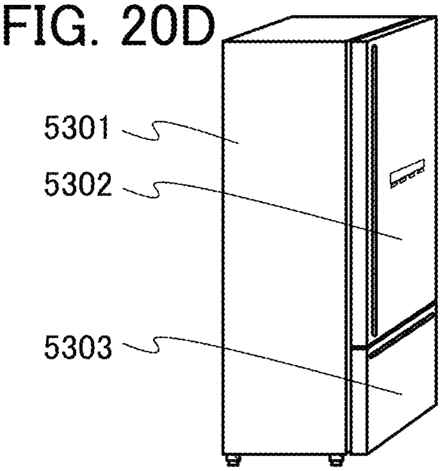

FIG. 20D is an electric refrigerator-freezer, which includes a housing 5301, a refrigerator door 5302, a freezer door 5303, and the like. The semiconductor device according to one embodiment of the present invention can be used for a variety of integrated circuits included in the electric refrigerator-freezer.

Figure 20E:
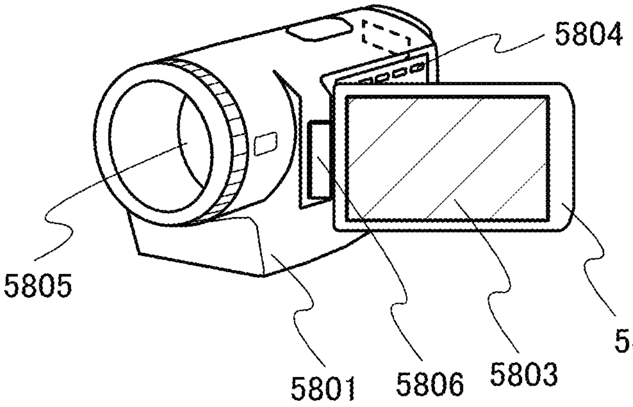

FIG. 20E is a video camera, which includes a first housing 5801, a second housing 5802, a display portion 5803, operation keys 5804, a lens 5805, a connection portion 5806, and the like. The operation keys 5804 and the lens 5805 are provided in the first housing 5801, and the display portion 5803 is provided in the second housing 5802. The semiconductor device according to one embodiment of the present invention can be used for a variety of integrated circuits included in the video camera. Furthermore, the first housing 5801 and the second housing 5802 are connected to each other with the connection portion 5806, and an angle between the first housing 5801 and the second housing 5802 can be changed with the connection portion 5806. Images on the display portion 5803 may be switched in accordance with the angle at the connection portion 5806 between the first housing 5801 and the second housing 5802.

Figure 20F:
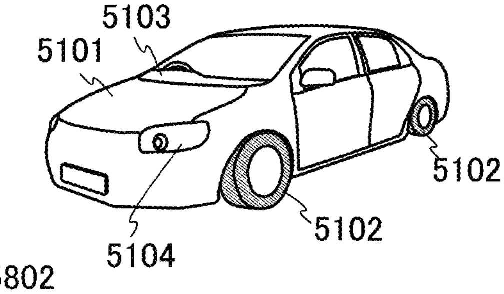

FIG. 20F is a motor vehicle, which includes a car body 5101, wheels 5102, a dashboard 5103, lights 5104, and the like. The semiconductor device according to one embodiment of the present invention can be used for a variety of integrated circuits included in the motor vehicle.

The configuration, structure, method, and the like described in this embodiment can be used in combination with the configurations, structures, methods, and the like described in the other embodiments, an example, and the like as appropriate.

Supplementary Notes on the Description in this Specification and the Like

The following are notes on the description of the above embodiments and the structures in the embodiments.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variations in signal, voltage, or current due to noise, variations in signal, voltage, or current due to a difference in timing, or the like can be included.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (or drain) terminal, a source (or drain) electrode, or the like as appropriate depending on the situation.

In addition, in this specification and the like, the term "electrode" or "wiring" does not limit the function of the component. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, the terms "film" and "layer" can be interchanged with each other depending on the case or situation. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conduction state (on state) or a non-conduction state (off state). Alternatively, a switch has a function of selecting and switching a current path.

In this specification and the like, channel length refers to, for example, the distance between a source and a drain in a region where a semiconductor (or a portion where current flows in a semiconductor when a transistor is in an on state) and a gate overlap each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap each other or a region where a channel is formed.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

REFERENCE NUMERALS

100A: semiconductor device, 100B: semiconductor device, 100C: semiconductor device, 100: semiconductor device, 110: switching signal output circuit, 120: multiplex data control system, 130_1: flip-flop, 130_2: flip-flop, 130_3: flip-flop, 130: flip-flop, 131: inverter, 132: clocked inverter, 140: majority circuit, 141: OR circuit, 142: AND circuit, 143: AND circuit, 144: OR circuit, 150: switching circuit, 160_1, 160_2: logic circuit, 170: power switch, and 180: logic circuit.

The invention claimed is:

1. A semiconductor device comprising:

a first flip-flop configured to retain input data in response to a clock signal and to output first output data based on the input data;

a second flip-flop configured to retain the input data in response to the clock signal and to output second output data based on the input data;

a third flip-flop configured to retain the input data in response to the clock signal and to output third output data based on the input data;

a majority circuit to which the first output data to the third output data are input and being configured to determine the most common logical value in the first output data to the third output data by majority decision making and to output data of the determined logical value as fourth output data; and a switching circuit to which the first output data and the fourth output data are input and being configured to output output data based on the first output data or the fourth output data in response to a switching signal, wherein the switching signal is a signal output from a switching signal output circuit, and wherein the switching signal output circuit outputs the switching signal in response to an error detection signal of an error detection circuit.

2. The semiconductor device according to claim 1, wherein the error detection circuit is a circuit detecting physical quantity corresponding to frequency of a soft error, and wherein the switching signal is a signal for selecting the first output data when the frequency of the soft error is low in the switching circuit and for selecting the fourth output data when the frequency of the soft error is high.

3. The semiconductor device according to claim 1, further comprising a logic circuit configured to control supply of the clock signal to the second flip-flop and the third flip-flop.

4. The semiconductor device according to claim 1, further comprising a power switch configured to stop supply of power supply voltage to the second flip-flop and the third flip-flop, wherein the power switch stops supply of power supply voltage to the second flip-flop and the third flip-flop when the first output data is selected as the output data in the switching circuit.

5. The semiconductor device according to claim 1, further comprising a power switch configured to stop supply of power supply voltage to the second flip-flop, the third flip-flop, and the majority circuit, wherein the power switch stops supply of power supply voltage to the second flip-flop, the third flip-flop, and the majority circuit when the first output data is selected as the output data in the switching circuit.

* * * * *